(12) United States Patent
Hu et al.

(10) Patent No.: US 11,482,499 B2
(45) Date of Patent: *Oct. 25, 2022

(54) SEAL RING FOR HYBRID-BOND

(71) Applicant: Taiwan Semiconductor Manufacturing Co., Ltd., Hsinchu (TW)

(72) Inventors: Chih-Chia Hu, Taipei (TW); Chun-Chiang Kuo, Kaohsiung (TW); Sen-Bor Jan, Tainan (TW); Ming-Fa Chen, Taichung (TW); Hsien-Wei Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/989,492

(22) Filed: Aug. 10, 2020

(65) Prior Publication Data

US 2020/0373253 A1 Nov. 26, 2020

Related U.S. Application Data

(63) Continuation of application No. 16/429,735, filed on Jun. 3, 2019, now Pat. No. 10,741,506, which is a
(Continued)

(51) Int. Cl.
*H01L 23/48* (2006.01)
*H01L 23/52* (2006.01)
(Continued)

(52) U.S. Cl.
CPC ........ *H01L 23/585* (2013.01); *H01L 23/5226* (2013.01); *H01L 23/53295* (2013.01); *H01L 24/03* (2013.01); *H01L 24/09* (2013.01); *H01L 24/33* (2013.01); *H01L 24/80* (2013.01); *H01L 24/83* (2013.01); *H01L 25/0657* (2013.01);
(Continued)

(58) Field of Classification Search
CPC combination set(s) only.
See application file for complete search history.

(56) References Cited

U.S. PATENT DOCUMENTS 8,802,504 B1 8/2014 Hou et al.
8,803,292 B2 8/2014 Chen et al.
(Continued)

FOREIGN PATENT DOCUMENTS

| CN | 101501855 A | 8/2009 |
|----|-------------|--------|
| TW | 201539725 A | 10/2015 |
| TW | 201729371 A | 8/2017 |

*Primary Examiner* — Niki H Nguyen
(74) *Attorney, Agent, or Firm* — Slater Matsil, LLP

(57) ABSTRACT

A structure includes a first die and a second die. The first die includes a first bonding layer having a first plurality of bond pads disposed therein and a first seal ring disposed in the first bonding layer. The first bonding layer extends over the first seal ring. The second die includes a second bonding layer having a second plurality of bond pads disposed therein. The first plurality of bond pads is bonded to the second plurality of bond pads. The first bonding layer is bonded to the second bonding layer. An area interposed between the first seal ring and the second bonding layer is free of bond pads.

20 Claims, 19 Drawing Sheets

Related U.S. Application Data continuation of application No. 16/003,654, filed on Jun. 8, 2018, now Pat. No. 10,312,201.

(60) Provisional application No. 62/592,856, filed on Nov. 30, 2017.

(51) Int. Cl.
    *H01L 29/40* (2006.01)
    *H01L 23/58* (2006.01)
    *H01L 23/522* (2006.01)
    *H01L 23/532* (2006.01)
    *H01L 29/06* (2006.01)
    *H01L 23/00* (2006.01)
    *H01L 25/00* (2006.01)
    *H01L 25/065* (2006.01)

(52) U.S. Cl.
    CPC .......... *H01L 25/50* (2013.01); *H01L 29/0649* (2013.01); *H01L 23/562* (2013.01); *H01L 2224/94* (2013.01); *H01L 2225/06513* (2013.01); *H01L 2225/06524* (2013.01); *H01L 2225/06565* (2013.01); *H01L 2225/06568* (2013.01); *H01L 2225/06593* (2013.01)

(56) References Cited

U.S. PATENT DOCUMENTS

| | | |
|---|---|---|
| 8,803,316 B2 | 8/2014 | Lin et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,299,736 B2 | 3/2016 | Chen et al. |
| 9,496,189 B2 | 3/2016 | Yu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,748,206 B1 | 8/2017 | Huang et al. |
| 9,761,522 B2 | 9/2017 | Chu et al. |
| 9,972,603 B2 | 5/2018 | Chu et al. |
| 10,312,201 B1 | 6/2019 | Hu et al. |
| 10,741,506 B2 * | 8/2020 | Hu ............ H01L 24/94 |
| 2007/0087067 A1 | 4/2007 | Yuan et al. |
| 2014/0117554 A1 * | 5/2014 | Uehling ............ H01L 23/49838 257/773 |
| 2015/0194455 A1 * | 7/2015 | Ho ............ H01L 25/50 257/460 |
| 2018/0114719 A1 * | 4/2018 | Briggs ............ H01L 21/76873 |

* cited by examiner

SEAL RING FOR HYBRID-BOND

PRIORITY CLAIM AND CROSS-REFERENCE

This application is a continuation of U.S. patent application Ser. No. 16/429,735, filed on Jun. 3, 2019, entitled "Seal Ring for Hybrid-Bond", which is a continuation of U.S. patent application Ser. No. 16/003,654, filed Jun. 8, 2018, entitled "Seal Ring for Hybrid-Bond", (now U.S. Pat. No. 10,312,201, issued Jun. 4, 2019), which claims priority to and the benefit of U.S. Provisional Application No. 62/592,856, filed on Nov. 30, 2017, entitled "Seal Ring for Hybrid-Bond," which application is hereby incorporated herein by reference in its entirety.

BACKGROUND

In wafer-to-wafer bonding technology, various methods have been developed to bond two package components (such as wafers) together. The available bonding methods include fusion bonding, eutectic bonding, direct metal bonding, hybrid bonding, and the like. In the fusion bonding, an oxide surface of a wafer is bonded to an oxide surface or a silicon surface of another wafer. In the eutectic bonding, two eutectic materials are placed together, and are applied with a high pressure and a high temperature. The eutectic materials are hence molten. When the melted eutectic materials are solidified, the wafers are bonded together. In the direct metal-to-metal bonding, two metal pads are pressed against each other at an elevated temperature, and the inter-diffusion of the metal pads causes the bonding of the metal pads. In the hybrid bonding, the metal pads of two wafers are bonded to each other through direct metal-to-metal bonding, and an oxide surface of one of the two wafers is bonded to an oxide surface or a silicon surface of the other wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
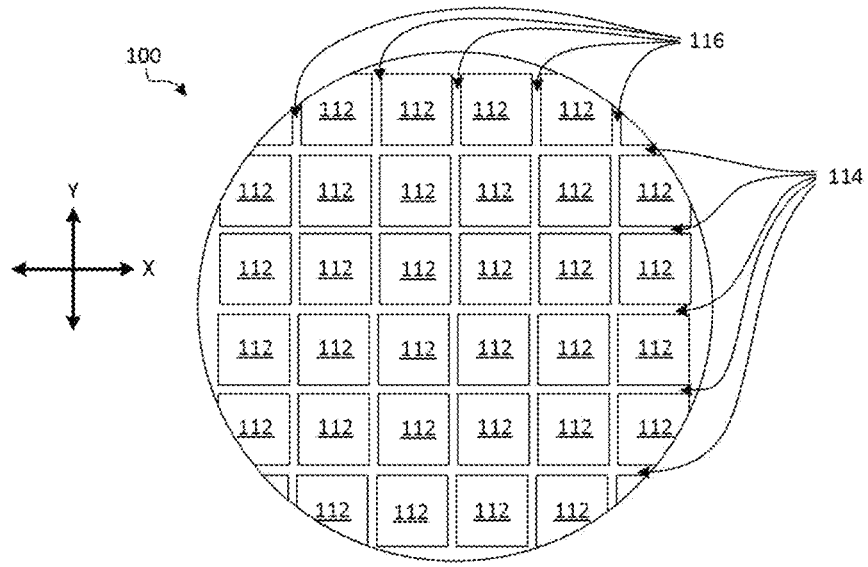
FIG. 1 illustrates a schematic top view of wafer, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments described herein provide a hybrid bonding of two distinct dies. Dies may be designed with bond pads to provide electrical and mechanical attachment points to bond another die or device thereto to form a package. Some of these bond pads may be "active," that is, electrically coupled to a component within the die, or "dummy," that is, electrically decoupled (e.g., floating) from any component with in the die. When a die is hybrid bonded to another die or component, dielectric materials at the surface of each die are aligned and fusion bonded together and metal bond pads in each die are aligned and directly bonded together. Die formation and processing to achieve suitable mating surfaces for hybrid bonding have heightened tolerances to help achieve a stronger or more reliable bonding. As such, to avoid tolerance variances resulting from die processing, such as dishing, a bond pad pattern is usually carried out over the entire surface of the die so that Chemical Mechanical Polishing (CMP) processes or the like uniformly affect the surface of the die for a predictable and uniform result. In some embodiments of the present disclosure, however, the design of the dies is altered to provide a zone where dummy bond pads are removed for mating to an area over a seal ring structure. Removing the dummy bond pads from the layout has been shown to increase bonding yield, especially where the spacing of the bond pads in the pattern is small. In other embodiments, rather than removing the dummy bond pads, the design is altered to mechanically and electrically couple the dummy bond pads to the seal ring. Embodiments described herein may be used in die-on-die, wafer-on-wafer (WoW), chip-on-chip (CoC), or chip-on-wafer (CoW) hybrid bonding processes where dummy bond pads are removed from an otherwise uniform contact pad layout design on the die, dummy bond pads are coupled to a seal ring, or a combination thereof.

Referring to the illustrated drawings, in Figures providing multiple views, Figures ending in an "a" indicate a perspective view illustration, figures ending in a "b" indicate a cross-section view illustration, and figures ending in a "c" indicate a top down view or plan view illustration. FIGS. 1-5 illustrate intermediate stages of a hybrid bonding technique, in accordance with some embodiments. FIGS. 1 through 2c illustrate a die 112, FIGS. 3 through 4c illustrate another die 212, and FIG. 5 illustrates a hybrid bonding of die 112 with die 212, in accordance with some embodiments.

FIG. 1 illustrates a schematic top view of wafer 100 in accordance with some embodiments. Wafer 100 includes dies 112 and the adjoining scribe lines 114 and scribe lines 116, wherein scribe lines 114 and scribe lines 116 separate dies 112 from each other. Scribe lines 114 have longitudinal directions parallel to the X direction, and scribe lines 116 have longitudinal directions parallel to the Y direction, which is perpendicular to the X direction. In each of dies 112, there may be one or more seal rings (e.g., shown as 136 in FIG. 2a), wherein the outer boundaries of the seal ring unit 136 define the outer boundaries of dies 112. Each of the scribe lines 114 is between and adjoining two rows of dies 112, and each of the scribe lines 116 is between and adjoining two columns of dies 112. It is noted that wafer 100 is intended to be an example only, and the sizes of dies 112, scribe lines 114 and scribe lines 116, etc. may vary based on the die designs.

Figure 2A:
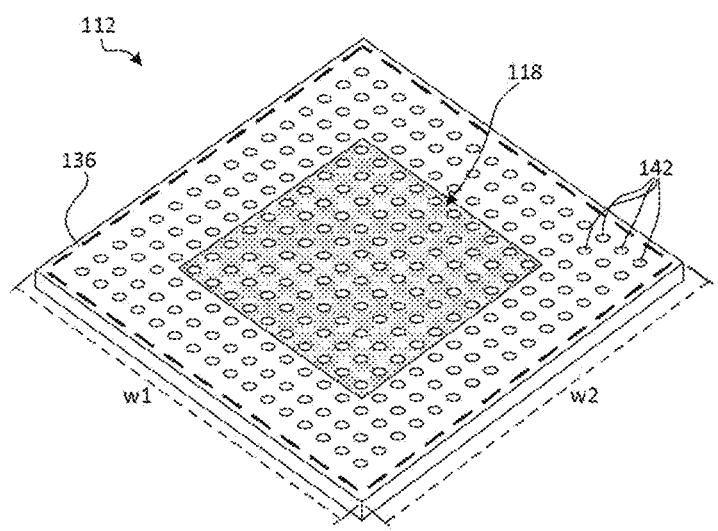
FIGS. 2a through 2c illustrate various views of a die, in accordance with some embodiments.

FIG. 2a illustrates a schematic perspective view of die 112. Die 112 in FIG. 2a may be singulated from wafer 100 or may still be intact with wafer 100. Seal ring unit 136 (shown in phantom) is disposed at a periphery of die 112 under the surface of the die and may include one or more distinct seal rings (described in greater detail below with respect to FIGS. 2b and 2c). In some embodiments, die 112 comprises an array of bond pads 142 set over and around a device area 118 of die 112. In some embodiments, the device area 118 may include the entire area of die 112 within seal ring unit 136. In other embodiments, the device area 118 may include a portion of the area of die 112 within seal ring unit 136, such as illustrated in FIG. 2a. In some embodiments, the device area 118 may include all the available bond pads 142 on the die or a subset of the available bond pads 142. Arrangements of bond pads 142 may be made in a pattern other than an array pattern. Bond pads 142 may be sized similarly or differently, depending on the design of the bond pads 142 on die 112.

Die 112 may include a logic device, micro-electro-mechanical systems (MEMS) device, integrated passive device (IPD), driver, or memory device such as memory cells including, and not limited to, Static Random Access Memory (SRAM) cells, Dynamic Random Access Memory (DRAM) Cells, Magneto-Resistive Random Access Memory (MRAM) cells, or the like. Die 112 may include other types of devices.

Die 112 may have first width, e.g., in the X direction of w1, which may be between about 2000 µm and about 26000 µm, such as about 10000 µm. Die 112 may have second width (or length), e.g., in the Y direction of w2, which may be between about 2000 µm and about 33000 µm, such as about 10000 µm. Other dimensions for die 112 may be used.

Figure 2B:
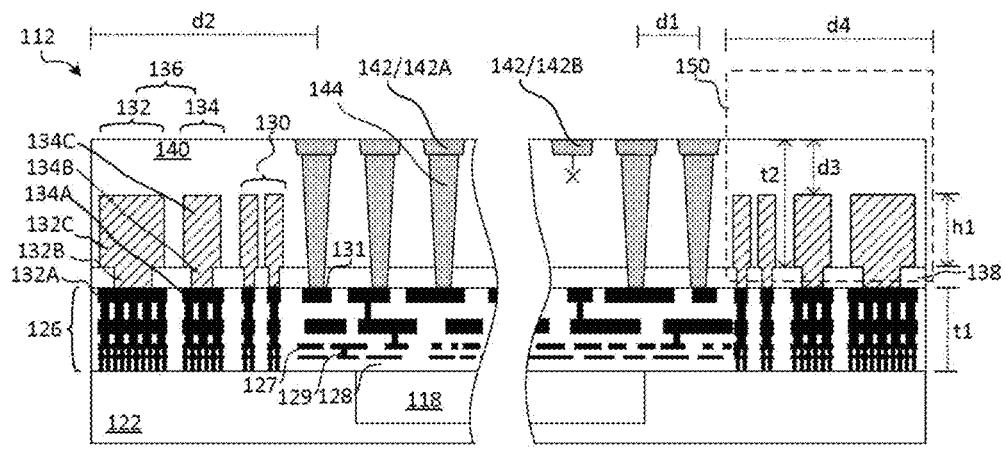
Figure 2C:
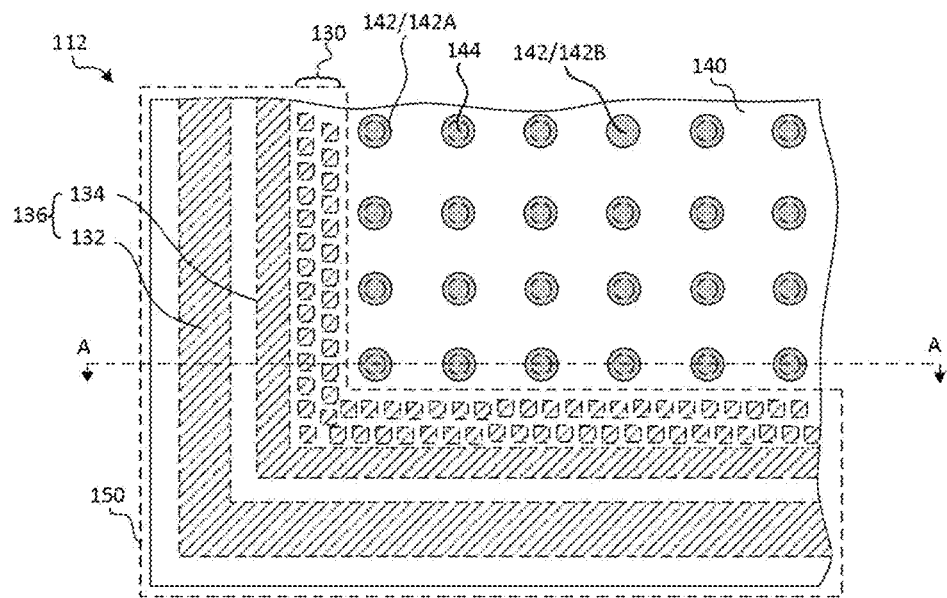
Figure 3:
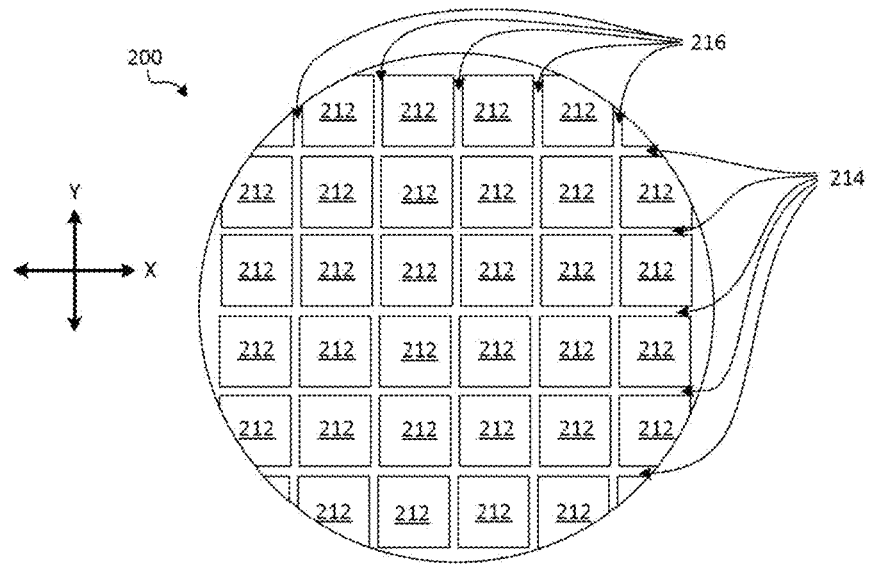
FIG. 3 illustrates a schematic top view of wafer, in accordance with some embodiments.

FIG. 2b illustrates a cross-sectional view of die 112. The cross-section of FIG. 2b is a portion of a cross-section taken along the line A-A of FIG. 2c, however the details may be varied from one view to another for the purposes of discussion. Die 112 includes a substrate 122, which may be a semiconductor substrate, such as a silicon substrate, a silicon germanium substrate, a silicon carbon substrate, an III-V compound semiconductor substrate, or the like. A device area 118 is formed at the surface or inside substrate 122. Device area 118 may comprise active or passive devices, such as transistors, resistors, capacitors, diodes, and the like. In some embodiments, device area 118 may comprise an encapsulated die.

An interconnect structure 126 may be formed over the substrate 122. Interconnect structure 126 may include insulating layers 128, such as an inter-layer dielectric (ILD) and/or inter-metal dielectric layers (IMD) and conductive features (e.g., metal lines 127 and vias 129) formed in alternating layers over substrate 122 using any suitable method. Interconnect structure 126 may connect various active and/or passive devices in device area 118 of substrate 122 to form functional circuits. The insulating layers 128 may comprise low-k dielectric materials having k values, for example, lower than about 4.0 or even 2.8. In some embodiments, insulating layers 128 may comprise undoped silicate glass (USG), spin-on carbon, and the like. The thickness t1 of interconnect structure 126 may be between about 0.1 µm and about 6 µm, such as about 4 µm. Other thicknesses may be used.

In some embodiments where device area 118 is an area of substrate 122 used to create various active and passive devices, interconnect structure 126 may be formed using a dual damascene process. A dual damascene process may include, for example, depositing insulating layers 128 (which may be formed as single layers or multiple layers separated by one or more etch stop layers), forming trenches in and via openings in the insulating layers to expose some portions of the metal lines 127 and vias 129, and filling the trenches and via openings with a conductive material to form more metal lines 127 and vias 129. Optional metal pads 131 can be formed in a top most layer of the interconnect structure 126 in a manner similar to forming the metal lines 127. A CMP is then performed to remove excess conductive material. Accordingly, the portions of the conductive material filling the trenches in the insulating layers 128 become the metal lines 127, respectively, while the portions of the conductive material filling the via openings become vias 129.

In embodiments where device area 118 is an encapsulated die, in an example to form interconnect structure 126, first an insulating layer 128 may be deposited over the substrate 122 and device area 118. In some embodiments, the insulating layer 128 is formed of a polymer, which may be a photo-sensitive material such as PBO, polyimide, BCB, or the like, that may be patterned using a lithography mask. In other embodiments, the insulating layer 128 is formed of a nitride such as silicon nitride; an oxide such as silicon oxide, PSG, BSG, BPSG; or the like. The insulating layer 128 may be formed by spin coating, lamination, CVD, the like, or a combination thereof. The insulating layer 128 may be formed of low-k materials.

The insulating layer 128 is then patterned. The patterning forms openings to expose portions of substrate 122 and device area 118 which include contacts (not shown) to the devices. The patterning may be by an acceptable process, such as by exposing the insulating layer 128 to light when the insulating layer 128 is a photo-sensitive material or by etching using, for example, an anisotropic etch. If the insulating layer 128 is a photo-sensitive material, the insulating layer 128 can be developed after the exposure.

To form a first layer of metal lines 127 and vias 129, a seed layer (not shown) is formed over the insulating layer 128 and in openings through the insulating layer 128. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the pattern of the metal lines 127. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the pattern of the metal lines 127 and vias 129. The vias 129 are formed in openings through insulating layer 128 to, e.g., the substrate 122 or device area 118.

A subsequent insulating layer 128 may then be deposited over the metal lines 127 and vias 129 and the process repeated as needed to form a multilayer interconnect which forms a circuit and provides input/output to the substrate 122 and device area 118. Optional metal pads 131 may be formed in a top most layer of the interconnect structure 126 in a manner similar to forming the metal lines 127.

Interconnect structure 126 also includes a seal ring structure 132A formed in a similar manner as the other layers of the interconnect structure 126, by alternating layers of metal lines and insulating materials where the metal lines are coupled by vias. The seal ring structure 132A may be included to help prevent delamination of the layers in the interconnect structure 126. In some embodiments, an additional seal ring structure 134A may be included. Seal ring structure 134A may be formed in a similar manner as the other layers of the interconnect structure 126 and seal ring structure 132A. The seal ring structure 134A may be wider than seal ring structure 132A, narrower than seal ring structure 132A, or the same width as seal ring structure 132A.

A passivation layer 138 may be formed over the interconnect structure 126 and patterned to form openings therein, exposing a top metal layer of the interconnect structure 126 and exposing a top metal layer of the seal ring structure 132A and a top metal layer of the seal ring structure 134A. Passivation layer 138 may be formed by the deposition and patterning of an insulating layer. In some embodiments, the passivation layer 138 is formed of a polymer, which may be a photo-sensitive material such as PBO, polyimide, BCB, or the like, that may be patterned using a lithography mask. In other embodiments, the passivation layer 138 is formed of a nitride such as silicon nitride; an oxide such as silicon oxide, PSG, BSG, BPSG; or the like. The passivation layer 138 may be formed by spin coating, lamination, CVD, the like, or a combination thereof. Passivation layer 138 may be between about 0.01 µm and 2 µm thick, such as about 0.9 µm thick. Other thicknesses may be used.

The passivation layer 138 is patterned to form openings to expose portions of the top metal layer of the interconnect structure 126. The patterning may be by an acceptable process, such as by exposing the passivation layer 138 to light when the passivation layer 138 is a photo-sensitive material or by etching using, for example, an anisotropic etch. If the passivation layer 138 is a photo-sensitive material, the passivation layer 138 can be developed after the exposure.

Seal rings structure 132A may be extended through and above the passivation layer 138. A via 132B may be formed in the passivation layer 138 and an overlying seal ring metal 132C may be formed over the passivation layer 138. The resulting seal ring 132 may therefore comprise seal ring structure 132A in interconnect structure 126, seal ring via 132B through passivation layer 138, and seal ring metal 132C. In some embodiments, additional seal rings may be included. In embodiments having one or more other seal rings, such as seal ring 134, such seal rings may similarly comprise the seal ring structure, such as seal ring structure 134A in the interconnect structure 126, a via, such as seal ring via 134B through passivation layer 138, and a seal ring metal, such as seal ring metal 134C. Seal ring unit 136 may comprise all of the seal rings surrounding the periphery of the die (e.g., seal ring 132, seal ring 134, and so forth). Seal ring metal 132C and seal ring metal 134C may form a continuous loop around the periphery of the die in a top down view.

Seal ring via 132B and 134B may be formed by a process similar to the formation of the metal lines and vias of interconnect structure 126, described above. The passivation layer 138 may be patterned to form openings therein corresponding to the seal ring via 132B and seal ring via 134B. A seed layer (not shown) may then be deposited over the passivation layer and in the openings. A subsequent mask can be deposited over the seed layer and patterned to create openings according to the seal ring metal 132C and seal ring metal 134C. The seal ring via 132B and seal ring metal 132C can then be formed by depositing a metal material such as copper, titanium, the like, or a combination thereof, formed by a plating process, such as electroless plating, electroplating, or the like on the seed layer first deposited in the openings and continuing the plating until the seal ring metal 132C has reached a desired height. The resulting seal ring metal 132C and seal ring metal 134C may have a height h1 of about 0.1 µm to about 2.8 µm, such as about 2.8 µm. Other heights may be used for the seal ring metal 132C and seal ring metal 134C. For example, in some embodiments, h1 may be less than 0.1 µm or greater than 2.8 µm. Seal ring via 134B and seal ring metal 134C may be formed simultaneously with seal ring via 132B and seal ring metal 132C. Following the formation of the seal ring 132 and seal ring 134, the mask may be removed by a suitable process, such as by ashing, and the remaining seed layer stripped away.

Crack stoppers 130 may be formed around the die using processes and materials similar to those discussed above with respect to seal ring 132 and seal ring 134, with the exception that the topmost layer of the crack stoppers 130 are not formed in a continuous ring, but are formed as discontinuous metal layers (see, e.g., the example top profile of crack stoppers 130 in FIG. 2c). In some embodiments, the crack stoppers 130 may extend into interconnect structure 126 in discontinuous segments which are aligned with the topmost layer of the crack stoppers 130. In some embodiments, the portion of the crack stoppers 130 in interconnect structure 126 may be formed in a continuous ring, similar to seal ring structure 132a, described above. Single or multiple rows of crack stoppers 130 may be used (see, e.g., FIG. 2c), in some embodiments, including one, two, three, four, five, or six, rows and so forth. Additional rows of crack stoppers 130 may be used. Crack stoppers 130 may be offset from one another to inhibit a crack from entering the inner part of die 112. For example, a crack which may start from an outside edge of die 112 and proceed toward the inner part of die 112 may be halted by one of the crack stoppers 130 and be stopped there instead of encroaching into the inner part of die 112. Each crack stopper 130 is designed to end propagation of any such cracks, rather than allow the crack to proceed past the crack stoppers 130 to the inner part of the die 112. Crack stoppers 130 may appear in a top down view (see FIG. 2c) as round, square, rectangular, or any suitable shape.

A bond dielectric layer 140 may be formed over the passivation layer 138. In some embodiments, bond dielectric layer 140 is an oxide layer, which may comprise silicon oxide. In other embodiments, bond dielectric layer 140 comprises other silicon and/or oxygen containing materials such as SiON, SiN, or the like, and may be formed by any suitable deposition technique. The bond dielectric layer 140 may be deposited to a thickness t2 of about 1.5 µm to about 7 µm, such as about 6 µm. Other thicknesses may be used. The top surfaces of the seal ring metal 132C and seal ring metal 134C may be covered by the bond dielectric layer 140. The distance d3 between the top surfaces of the seal ring metal 132C, for example, and the top surface of the bond dielectric layer 140 may be about 1.2 µm to about 1.4 µm, such as about 1.3 µm. Other distances for distance d3 may be used.

Bond pads 142 are formed in bond dielectric layer 140, and may be electrically coupled to device area 118 through metal lines and vias, including bond pad vias 144. Bond pads 142 may be formed of copper, aluminum, nickel, tungsten, or alloys thereof. The top surface of bond dielectric layer 140 and the top surfaces of bond pads 142 are level with each other, which is achieved through a planarization that is performed during the formation of bond pads 142. The planarization may comprise Chemical Mechanical Polish (CMP).

Bond pads 142 may be electrically connected to metal lines 127 and vias 129 by a corresponding bond pad via 144 for each bond pad 142. In some embodiments, no bond pad vias 144 are formed between bond pads 142 and the top metal of metal lines 127. Accordingly, the bond pads may be in direct physical contact with the top metal of the metal lines 127. In some embodiments, one or more bond pad vias 144 may extend to the top of the bond dielectric layer 140 and the corresponding bond pad 142 may be omitted.

Bond pad vias 144 may be formed by patterning the bond dielectric layer 140 to form openings which expose metal lines 127 or optional metal pads 131 of interconnect structure 126. A metal material such as copper, titanium, the like, or a combination thereof, may be deposited in the openings by a suitable deposition process, such as by a plating process, such as electroless plating, electroplating, or the like on an optional seed layer first deposited in the openings. In some embodiments, after formation of the bond pad vias 144, an additional layer of the bond dielectric layer 140 may be deposited over the bond pad vias 144, and the bond dielectric layer 140 patterned again to provide openings corresponding to the bond pads 142. Bond pads 142 may then be formed by depositing a metal material such as copper, titanium, the like, or a combination thereof, formed by a plating process, such as electroless plating, electroplating, or the like on an optional seed layer first deposited in the openings. In some embodiments, other deposition processes may be used instead of or in combination with a plating process, such as ALD, CVD, and the like. Excess material of the bond pads 142 may be removed by planarization, such as a CMP.

As shown in FIGS. 2a, 2b, and 2c, bond pads 142 are distributed uniformly or substantially uniformly (for example, with a pattern-density variation smaller than about 10 percent). The (substantially) uniformly distributed bond pads 142 may be distributed throughout an entirety or substantially the entirety of (for example, more than 90 or 95 percent) of die 112. However, rather than the (substantially) uniformly distributed bond pads 142 extending all the way to the edges of die 112, including over the seal ring unit 136, the design may be altered by removing the bond pads which would be over the seal ring unit 136 if the adjacent pattern were allowed to continue over the seal ring unit 136. Furthermore, all or substantially all (such as more than 90 percent) of bond pads 142 throughout the entire die 112 may have a same top-view shape, a same top-view size, and/or a same pitch. Accordingly, bond pads 142 may have a uniform pattern density throughout die 112, except for the area over the seal ring unit 136. In some embodiments, the distance d1 may be between about 2 µm and about 10 µm, such as about 9 µm. Other distances for the pitch may be used. In some embodiments, the width d4 of the seal ring unit 136 and crack stop unit 130 may be between about 20 µm and about 22 µm, such as about 22 µm. In some embodiments, the width d4 of the seal ring unit 136 and crack stop unit 130 may be less than 20 µm, such as about 4 µm or may be greater than 22 µm, such as about 30 µm. Other distances may be used.

Removing the bond pads which would be over the seal ring unit 136 produces keep out zone 150. Keep out zone 150 may extend further toward the inner part of die 112 than the seal ring unit 136. For example, keep out zone 150 may include an area over crack stoppers 130. In some embodiments, keep out zone 150 may include an area over a portion of metal lines 127, vias 129, or optional metal pads 131 of interconnect structure 126. A pattern design for bond pads 142 may initially include bond pads in keep out zone 150. The pattern design may then be altered before manufacturing to remove bond pads 142 from the design where keep out zone 150 is located on die 112. For example, as illustrated in FIG. 2b, keep out zone 150 corresponds to the location of the seal ring unit 136 and extends into the inner part of die 112 over the crack stoppers 130 and over a portion of a metal line 127 of interconnect structure 126. In other embodiments, the keep out zone may be located in other areas of the die (see, e.g., FIG. 7b and its description) which is described in greater detail in discussing other embodiments, below. The location of keep out zone 150 is based at least in part on where a second die will be bonded to die 112. When the second die has the same footprint dimensions, the keep out zone 150 will be located at the periphery of the die, corresponding to the area of the seal ring unit 136. When the second die has a smaller footprint, the keep out zone 150 will be located at least in part in an interior part of the die. Examples of such embodiments are described in greater detail below with respect to FIGS. 6 through 11.

In some embodiments, bond pads 142 may include a plurality of active metal pads 142A and a plurality of dummy metal pads 142B. Dummy metal pads 142B do not have electrical functions. Active metal pads 142A may be electrically connected to device area 118 through bond pad vias 144 and interconnect structure 126. Dummy metal pads 142B are electrically disconnected from devices in die 112, where the symbol "x" represents that no electrical connection exists to connect dummy metal pads 142B to device area 118. Accordingly, dummy metal pads 142B may be electrically floating. In some embodiments, active metal pads 142A and dummy metal pads 142B have the same top-view shape, the same top-view size, and comprise the same material. Furthermore, active metal pads 142A and dummy metal pads 142B are formed simultaneously. In alternative embodiments, active metal pads 142A and dummy metal pads 142B have different top-view shapes and/or different top-view sizes.

Active metal pads 142A and dummy metal pads 142B may have a same top-view shape and/or a same top-view size. Therefore, whether a bond pad 142 is used as an active metal pad 142A or a dummy metal pad 142B is determined by its electrical connection such as whether it is connected to device area 118 or not. It should be understood that reference in the figures to a bond pad 142 contemplates both an active metal pad 142A and dummy metal pad 142B depending on the die design. The designers who design die 112 may uniformly distribute bond pads 142 throughout die 112 and/or wafer 100, and the electrical connections from device area 118 to bond pads 142 are made depending on the convenience in metal routing. For example, when an electrical connection needs to be made to connect to a part of device area 118, the most convenient bond pad 142, which may be the one nearest to the part of device area 118, or the one that is easiest to route to, is selected as the active metal pad 142A. The bond pads 142 that are not selected thus become dummy metal pads 142B.

FIG. 2c illustrates a top view of a corner portion of die 112. Although seal ring unit 136 and crack stoppers 130 would not be visible in the top view, they have been illustrated for context and provided with dashed outside edges. The seal ring unit 136 comprising seal ring 132 and seal ring 134 is illustrated to continue around the periphery of die 112. All the bond pads 142 are contained within the seal ring unit 136. A keep out zone 150 for the seal ring unit 136 provides an area over the seal ring unit 136 which is free from bond pads 142. The keep out zone 150 may continue around the entire edge of die 112. The top surface of the seal ring unit 136 is below the surface of the bond dielectric layer 140. As such, the keep out zone 150 provides a bond-dielectric-layer area free of metal features continuously extending from one edge of the keep out zone to the other edges of the keep out zone for fusion bonding to another die while being unencumbered by any metal features. When the keep out zone 150 is aligned to a keep out zone on another die, and bonded thereto, the bond yield rate is improved. The width d4 (see FIG. 2b) of the keep out zone 150 may be between about 20 µm and about 21.6 µm, such as about 21.6 µm. Other distances may be used for the width of the keep out zone 150. The length of the keep out zone 150 may vary based on the size of the die which is to be bonded to die 112.

FIG. 2c also illustrates that some bond pads 142 may be active bond pads having an active metal pad 142A which is coupled to a bond pad via 144 (shown in phantom). Other bond pads 142 in the pattern may be dummy bond pads having a dummy metal pad 142B which is not coupled to a bond pad via 144.

Figure 4A:
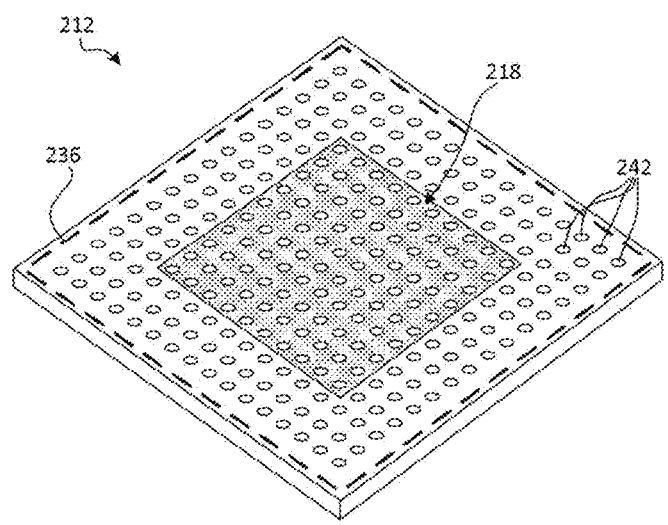
FIGS. 4a through 4c illustrate various views of a die, in accordance with some embodiments.
Figure 4B:
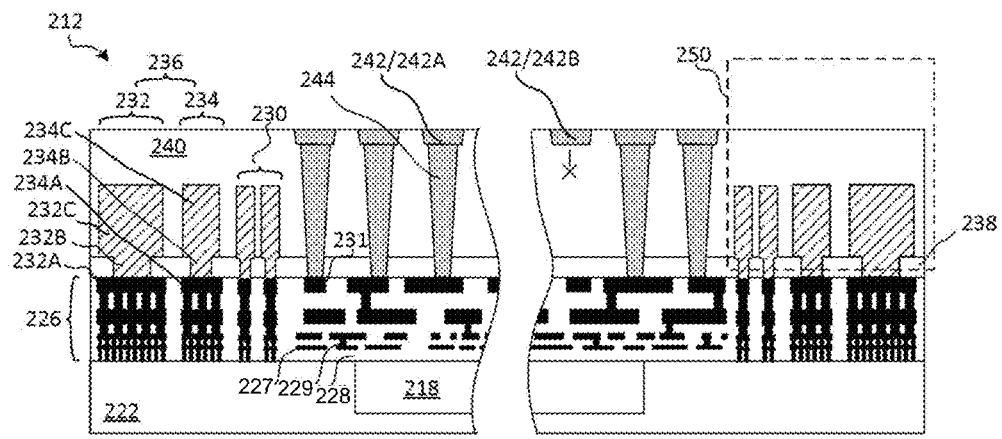
Figure 4C:
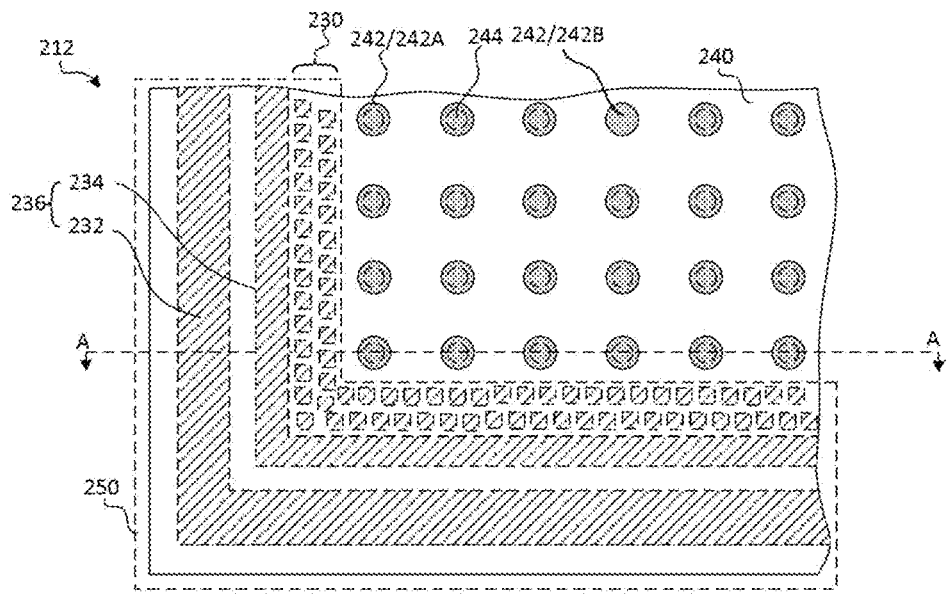
Figure 5:
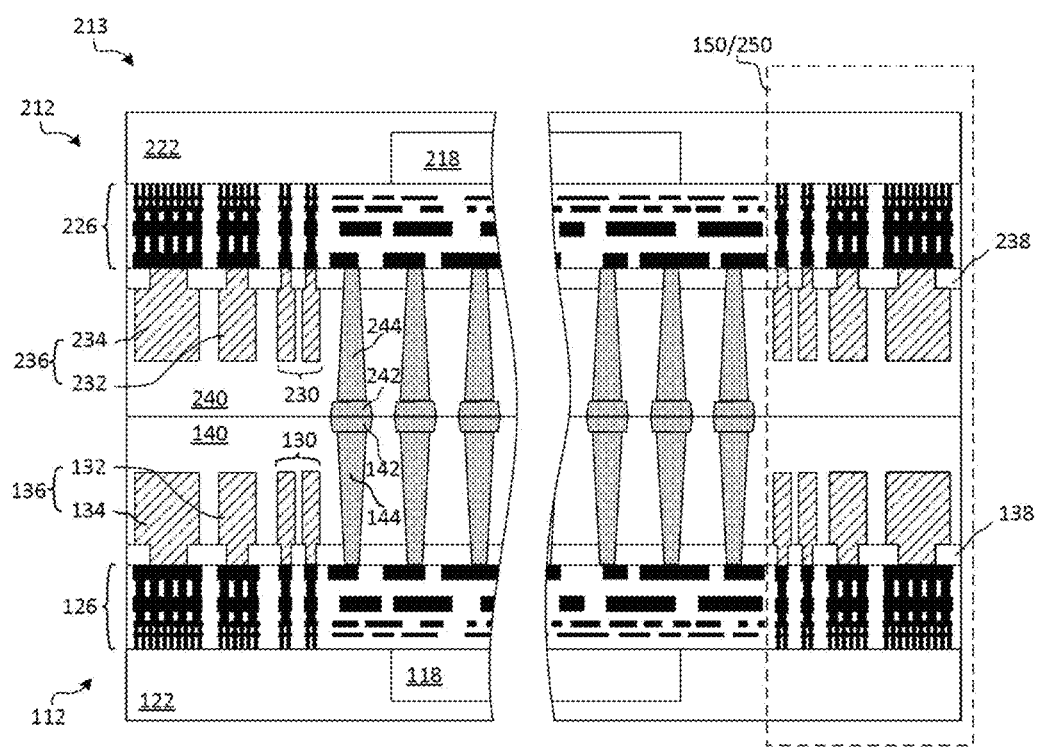
FIG. 5 illustrates a cross-sectional view of two bonded dies, in accordance with some embodiments.

FIGS. 3 through 4c illustrate another die 212 in accordance with some embodiments. FIG. 3 illustrates a schematic top view of wafer 200 in accordance with some embodiments. Wafer 200 includes dies 212 and the adjoining scribe lines 214 and 216, wherein scribe lines 214 and 216 separate dies 212 from each other. Scribe lines 214 have longitudinal directions parallel to the X direction, and scribe lines 216 have longitudinal directions parallel to the Y direction, which is perpendicular to the X direction. In each of dies 212, there may be one or more seal rings (e.g., shown as 236 in FIG. 4a), wherein the outer boundaries of the seal rings define the outer boundaries of dies 212. Each of the scribe lines 214 is between and adjoining two rows of dies 212, and each of the scribe lines 216 is between and adjoining two columns of dies 212. It is noted that wafer 200 is intended to be an example only, and the sizes of dies 212, scribe lines 214 and 216, etc. may vary based on the die designs.

FIG. 4a illustrates a schematic perspective view of die 212. Die 212 in FIG. 4a may be singulated from wafer 200 or may still be intact with wafer 200. Seal ring unit 236 (shown in phantom) is disposed at a periphery of die 212 under the surface of die 212 and may include one or more distinct seal rings (described in greater detail below with respect to FIGS. 4b and 4c). In some embodiments, die 212 comprises an array of bond pads 242 set over and around a device area 218 of die 212. In some embodiments, the device area 218 may include the entire area of die 212 within seal ring unit 236. In other embodiments, the device area 218 may include a portion of the area of die 212 within seal ring unit 236, such as illustrated in FIG. 4a. In some embodiments, the device area 218 may include all the available bond pads 242 on the die or a subset of the available bond pads 242. Arrangements of bond pads 242 may be made in a pattern other than an array pattern. Bond pads 242 may be sized similarly or differently, depending on the design of the bond pads 242 on die 212.

Die 212 may be a similar or identical device as die 112, in some embodiments and may have similar dimensions thereto, including thicknesses of layers and so forth. In some embodiments, die 212 can be different than die 112, and may include a logic device or memory device such as memory cells including, and not limited to, Static Random Access Memory (SRAM) cells, Dynamic Random Access Memory (DRAM) Cells, Magneto-Resistive Random Access Memory (MRAM) cells, or the like. Die 212 may include other types of devices.

FIG. 4b illustrates a cross-sectional view of die 212. The cross-section of FIG. 4b is a portion of a cross-section taken along the line A-A of FIG. 4c, however the details may be varied from one view to another for the purposes of discussion. Die 212 includes substrate 222 which may be a semiconductor substrate, such as a silicon substrate, a silicon germanium substrate, a silicon carbon substrate, an III-V compound semiconductor substrate, or the like. A device area 218 is formed at the surface or inside substrate 222. Device area 218 may comprise active or passive devices, such as transistors, resistors, capacitors, diodes, and the like. In some embodiments, device area 218 may comprise an encapsulated die.

An interconnect structure 226 may be formed over the substrate 222. Interconnect structure 226 may include insulating layers 228, such as an inter-layer dielectric (ILD) and/or inter-metal dielectric layers (IMD) and conductive features (e.g., metal lines 227, vias 229, and optional metal pads 231) formed in alternating layers over substrate 222 using processes and materials such as those described above with respect to interconnect structure 126 of FIG. 2b, which are not repeated. Interconnect structure 226 may connect various active and/or passive devices in device area 218 of substrate 222 to form functional circuits.

The interconnect structure 226 also includes a seal ring structure 232A formed in a similar manner as the other layers of the interconnect structure 226, by alternating layers of metal lines and insulating materials where the metal lines are coupled by vias. The seal ring structure 232A may be included to help prevent delamination of the layers in the interconnect structure 226. In some embodiments, an additional seal ring structure 234A may be included. Seal ring structure 234A may be formed in a similar manner as the other layers of the interconnect structure 226 and seal ring structure 232A. The seal ring structure 234A may be wider than seal ring structure 232A, narrower than seal ring structure 232A, or the same width as seal ring structure 232A.

A passivation layer 238 may be formed over the interconnect structure 226 and patterned to form openings therein, exposing a top metal layer of the interconnect structure 226 (or optional metal pad 231) and exposing a top metal layer of the seal ring structure 232A and a top metal layer of the seal ring structure 234A. Passivation layer 238 may be formed using processes and materials such as those discussed above with respect to passivation layer 138, which are not repeated.

Seal ring structure 232A may be extended through and above the passivation layer 238. A via 232B may be formed in the passivation layer 238 and an overlying seal ring metal 232C may be formed over the passivation layer 238. The resulting seal ring 232 may therefore comprise seal ring structure 232A in interconnect structure 226, seal ring via 232B through passivation layer 238, and seal ring metal 232C. In some embodiments, additional seal rings may be included. In embodiments having another seal ring, such as seal ring 234, such seal rings may similarly comprise the seal ring structure, such as seal ring structure 234A in the interconnect structure 226, a via, such as via 234B through passivation layer 238, and a seal ring metal, such as seal ring metal 234C. Seal ring unit 236 may comprise all of the seal rings surrounding the periphery of the die (e.g., seal ring 232, seal ring 234, and so forth). Seal ring metal 232C and seal ring metal 234C may form a continuous loop around the periphery of the die in a top down view.

Seal ring via 232B or seal ring via 234B may be formed using processes and materials such as those discussed above with respect to seal ring via 132B and seal ring via 134B, which are not repeated. Similarly, seal ring metal 232C and 234C may be formed using processes and materials such as those discussed above with respect to seal ring metal 132C and seal ring metal 134C, which are not repeated.

Crack stoppers 230 may be formed around the die. Crack stoppers 230 may be formed using processes and materials such as described above with respect to crack stoppers 130 which are not repeated.

A bond dielectric layer 240 may be formed over the passivation layer 238. In some embodiments, bond dielectric layer 240 is an oxide layer, which may comprise silicon oxide. In other embodiments, bond dielectric layer 240 comprises other silicon and/or oxygen containing materials such as SiON, SiN, or the like. Bond pads 242 are formed in bond dielectric layer 240, and may be electrically coupled to device area 218 through metal lines and vias, including bond pad vias 244. Bond pads 242 may be formed of copper, aluminum, nickel, tungsten, or alloys thereof. The top surfaces of the seal ring metal 232C and seal ring metal 234C may be covered by the bond dielectric layer 240. The top surface of bond dielectric layer 240 and the top surfaces of bond pads 242 are level with each other, which is achieved through a planarization that is performed during the formation of bond pads 242. The planarization may comprise a CMP process.

Bond pads 242 may be electrically connected to metal lines 227 and vias 229 by a corresponding bond pad via 244 for each bond pad 242. In some embodiments, no bond pad vias 244 are formed between bond pads 242 and the top metal of metal lines 227. Accordingly, the bond pads may be in direct physical contact with the top metal of the metal lines 227. In some embodiments, one or more bond pad vias 244 may extend to the top of the bond dielectric layer 240 and the corresponding bond pad 242 may be omitted. Bond pad vias 244 and bond pads 242 may be formed using processes and materials such as those discussed above with respect to the bond pad vias 144 and bond pads 142 of FIG. 2b, which are not repeated.

In some embodiments, bond pads 242 may include a plurality of active metal pads 242A and a plurality of dummy metal pads 242B, similar to the active metal pads 142A and dummy metal pads 142B of FIG. 2b.

Referring now to FIG. 4c, FIG. 4c illustrates a top view of a corner portion of die 212. The seal ring unit 236 comprising seal ring 232 and seal ring 234 is illustrated to continue around the periphery of die 212. All the bond pads 242 are contained within the seal ring unit 236. A keep out zone 250 for the seal ring unit 236 provides an area over the seal ring unit 236 which is free from bond pads 242. Keep out zone 250 is similar in size and shape as keep out zone 150 of die 112. Keep out zone 250 is sized to be aligned to keep out zone 150 of die 112 and has a dielectric bond area which continuously extends from one edge of the keep out zone to the other edges of the keep out zone for fusion bonding to another die while being unencumbered by any metal features. The top surface of the seal ring unit 236 is below the surface of the bond dielectric layer 240. As such, the keep out zone 250 provides a dielectric bond area for fusion bonding to another die, such as die 112. Keep out zone 250 may be located using similar processes as described above with respect to keep out zone 150 of FIGS. 2b and 2c.

Referring to FIG. 5, FIG. 5 illustrates a cross-section that includes die 112 bonded to die 212 to form die package 213. Bonding can be wafer-to-wafer where both wafers are directly bonded together, chip-to-chip where two singulated chips (or dies) are directly bonded together, or chip-to-wafer where one or more chips (or dies) are directly bonded together, wherein the dielectric layers of one die are fusion bonded to another die and the metal layers of one die and another die are bonded together without using any eutectic material, such as solder. For example, in a wafer-to-wafer bonding, the bonding of wafer 100 to wafer 200 is through hybrid bonding, wherein dies 112 are bonded to dies 212 prior to singulation. In the hybrid bonding of wafers 100 and 200, bond dielectric layer 140 is bonded to bond dielectric layer 240 through fusion bonding, and the metal of bond pads 142 are bonded to the metal of bond pads 242 through metal-to-metal bonding. Chip-to-chip or chip-to-wafer bonding proceeds similarly, except for the method used for aligning the chips or chips and wafer.

The bonding may include a pre-bonding and an annealing. During the pre-bonding, a small pressing force is applied to press wafers 100 and 200 against each other. The pre-bonding may be performed at the room temperature (for example, between about 21° C. to about 25° C.), although higher temperatures may be used. After the pre-bonding, bond dielectric layers 140 and 240 are bonded to each other. The bonding strength is improved in a subsequent annealing step, in which the bonded wafers 100 and 200 are annealed at a temperature between about 300° C. and about 400° C., for example.

The annealing may be performed for a period of time between about 1 hour and 2 hours. When temperature rises, the OH bond in bond dielectric layer 140 and bond dielectric layer 240 break to form strong Si—O—Si bonds, and hence wafers 100 and 200 are bonded to each other through fusion bonds (and through Van Der Waals force). In addition, during the annealing, the metal (such as copper) in bond pads 142 and bond pads 242 diffuse into each other, so that metal-to-metal bonds are also formed. Hence, the resulting bonds between wafers 100 and 200 are hybrid bonds. After the bonding, the bonded wafer 100 and 200 may be sawed into packages, with each of the packages including die 112 bonded to die 212.

As shown in FIG. 5, bond pads 142 and bond pads 242 are bonded to each other with a one-to-one correspondence. In some embodiments, each of bond pads 142 has a corresponding bond pad 242 to bond to, and each of bond pads 242 has a corresponding bond pad 142 to bond to. Active metal pads 142A are bonded to active metal pads 242A, and dummy metal pads 142B are bonded to dummy metal pads 242B. In some embodiments, dummy metal pads may be bonded to active metal pads. For example, dummy metal pad 142B may be bonded to active metal pad 242A. In some embodiments, a misalignment might occur in the pattern or in the alignment of one wafer to the other and a portion of one or more of bond pads 142 may slightly overhang or underhang a corresponding one of bond pads 242.

Removing dummy metal pads 142B and 242B from over the seal ring units 136 and 236 provides for a more reliable bonding to the bond dielectric layers 140 and 240, thereby improving bonding yield and creating bonds less prone to bond failure. This result is unexpected because including dummy metal pads in this area can provide a more uniform pattern density which would result in a more level surface following planarization.

Figure 6:
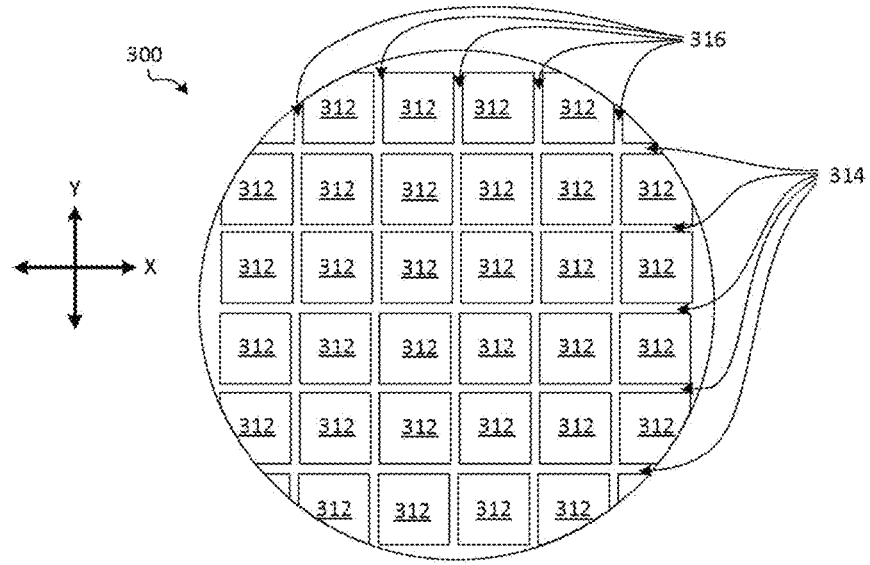
FIG. 6 illustrates a schematic top view of wafer, in accordance with some embodiments.

The embodiments discussed above apply when the die sizes are the same such that the edges of the two dies are aligned. Similar processes can be used to provide bonding with dies of two different sizes. FIGS. 6 through 7c illustrate another die 312 in accordance with some embodiments. FIG. 6 illustrates a schematic top view of wafer 300 in accordance with some embodiments. Wafer 300 includes dies 312 and the adjoining scribe lines 314 and 316 similar to scribe lines 114 and 116 of FIG. 1.

Figure 7A:
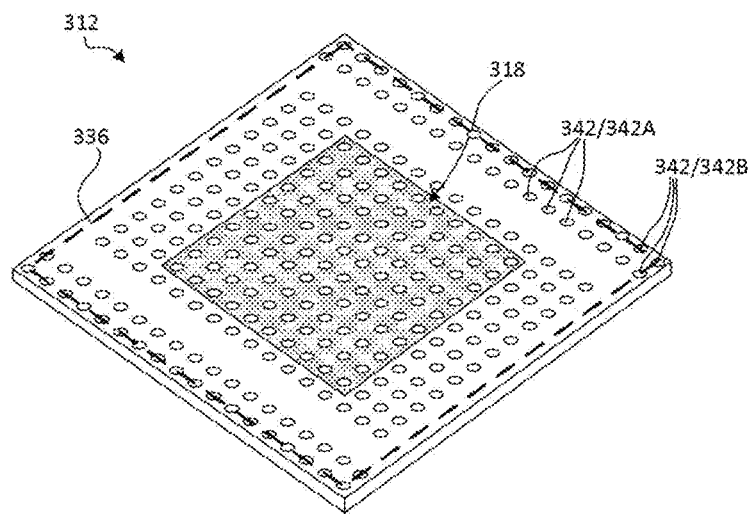
FIGS. 7a through 7c illustrate various views of a die, in accordance with some embodiments.

FIG. 7a illustrates a schematic perspective view of die 312. Die 312 in FIG. 7a may be singulated from wafer 300 or may still be intact with wafer 300. Seal ring unit 336 is disposed at a periphery of die 312 and may include one or more distinct seal rings (described in greater detail below with respect to FIGS. 7b and 7c). In some embodiments, die 312 comprises an array of bond pads 342 set over and around a device area 318 of die 312. In some embodiments, the device area 318 may include the entire area of die 312 within seal ring unit 336. In other embodiments, the device area 318 may include a portion of the area of die 312 within seal ring unit 336, such as illustrated in FIG. 7a. In some embodiments, the device area 318 may include all the available bond pads 342 on the die or a subset of the available bond pads 342. Arrangements of bond pads 342 may be made in a pattern other than an array pattern. Bond pads 342 may be sized similarly or differently, depending on the design of the bond pads 342 on die 312.

Die 312 may be a similar device as die 112, in some embodiments, and may have similar dimensions thereto, including thicknesses of layers and so forth. In some embodiments, die 312 may include a logic device or memory device such as memory cells including, and not limited to, Static Random Access Memory (SRAM) cells, Dynamic Random Access Memory (DRAM) Cells, Magneto-Resistive Random Access Memory (MRAM) cells, or the like. Die 312 may include other types of devices.

Figure 7B:
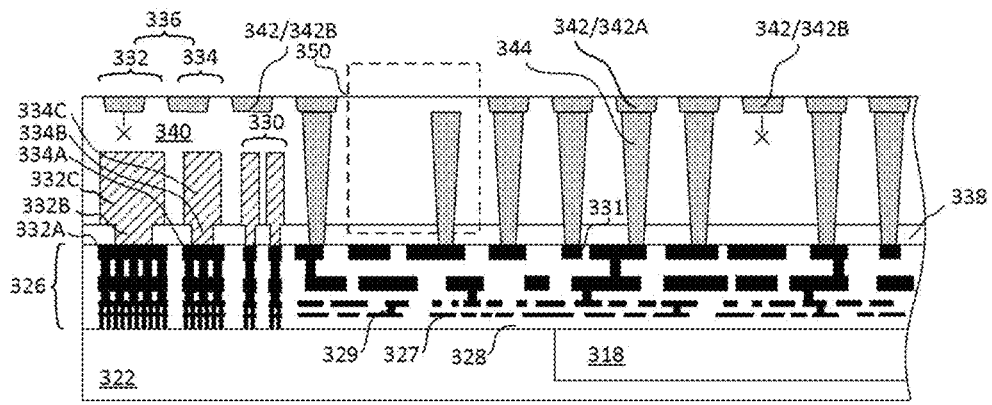
Figure 7C:
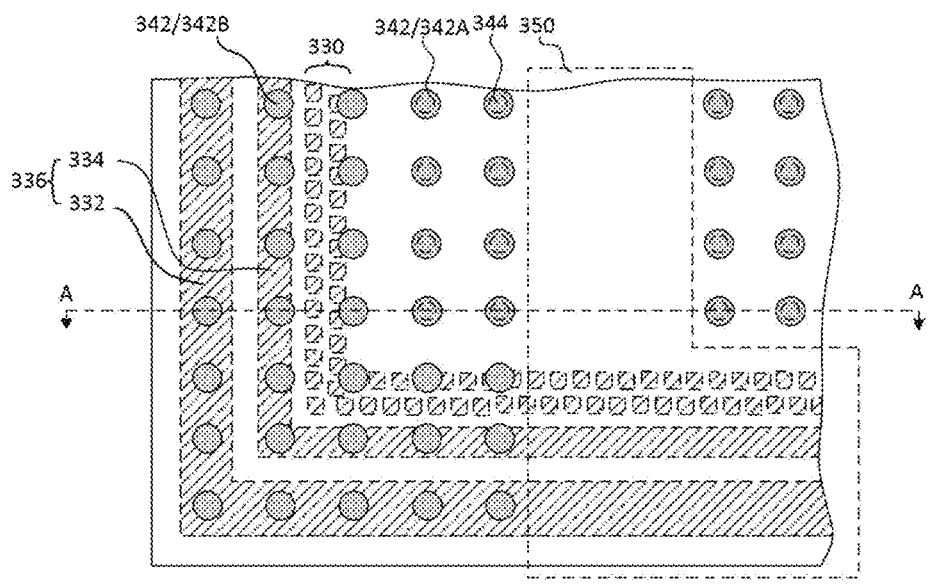

FIG. 7b illustrates a cross-sectional view of die 312. The cross-section of FIG. 7b is a portion of a cross-section taken along the line A-A of FIG. 7c, however the details may be varied from one view to another for the purposes of discussion. Die 312 includes a substrate 322, similar to substrate 122 and device area 318, similar to device area 118.

An interconnect structure 326 may be formed over substrate 322. Interconnect structure 326 may include insulating layers 328 and conductive features (e.g., metal lines 327, vias 329, and optional metal pads 331). Interconnect structure 326 may connect various active and/or passive devices in device area 318 of substrate 322 to form functional circuits. Interconnect structure 326 may be formed using materials and processes similar to those discussed above with respect to interconnect structure 126 of FIG. 2b, which are not repeated.

Interconnect structure 326 also includes a seal ring structure 332A, similar to seal ring structure 132A of FIG. 2b. Other seal ring structures, such as seal ring structure 334A may also be formed in interconnect structure 326. Seal ring structure 332A and seal ring structure 334A may be formed in a similar manner as the other layers of the interconnect structure 326.

A passivation layer 338 may be formed over the interconnect structure 326 and patterned to form openings therein, exposing a top metal layer of the interconnect structure 326 (or optional metal pad 331) and exposing a top metal layer of the seal ring structure 332A and a top metal layer of the seal ring structure 334A. Passivation layer 338 may be formed using processes and materials such as those discussed above with respect to passivation layer 138, which are not repeated.

Seal ring structure 332A may be extended through and over the passivation layer 338. A via 332B may be formed in the passivation layer 338 and an overlying seal ring metal 332C may be formed over the passivation layer 338. The resulting seal ring 332 may therefore comprise seal ring structure 332A in interconnect structure 326, seal ring via 332B through passivation layer 338, and seal ring metal 332C. In some embodiments, additional seal rings may be included. In embodiments having additional seal rings, such as seal ring 334, such seal rings may similarly comprise the seal ring structure, such as seal ring structure 334A in the interconnect structure 326, a via, such as via 334B through passivation layer 338, and a seal ring metal, such as seal ring metal 334C. Seal ring unit 336 may comprise all of the seal rings surrounding the periphery of the die (e.g., seal ring 332, seal ring 334, and so forth). Seal ring metal 332C and seal ring metal 334C may form a continuous loop around the periphery of the die in a top down view.

Seal ring via 332B and seal ring via 334B may be formed using processes and materials such as those discussed above with respect to seal ring via 132B and seal ring via 134B, which are not repeated. Similarly, seal ring metal 332C and seal ring metal 334C may be formed using processes and materials such as those discussed above with respect to seal ring metal 132C and seal ring metal 134C, which are not repeated.

Crack stoppers 330 may be formed around the die. Crack stoppers 430 may be formed using processes and materials such as described above with respect to crack stoppers 130 which are not repeated.

A bond dielectric layer 340 may be formed over the passivation layer 338 and seal ring unit 336. Bond dielectric layer 340 may be formed using processes and materials similar to those discussed above with respect to bond dielectric layer 140, which are not repeated.

Bond pads 342 are formed in bond dielectric layer 340, and may be electrically coupled to device area 318 through metal lines and vias, including bond pad vias 344. Bond pads 342 and bond pad vias 344 may be formed using processes and materials such as those discussed above with respect to bond pads 142 and bond pad vias 144, which are not repeated. Bond pads 342 may include a plurality of active metal pads 342A and a plurality of dummy metal pads 342B, similar to the active metal pads 142A and dummy metal pads 142B of FIG. 2b.

Still referring to FIG. 7b, the dummy metal pads 342B can be removed from the design pattern where the seal ring from the die to be bonded will interface with die 312. Keep out zone 350 illustrates an area of the bond dielectric layer 340 which has a surface comprising a continuous dielectric interface layer which is free from bond pads 342. As illustrated in FIG. 7b, dummy metal pads 342B may be included over the seal ring unit 336 as part of the substantially uniform pattern of bond pads 342. In other embodiments, the dummy metal pads 342B are optional and may be omitted from over the seal ring unit 336. Other dummy metal pads 342B may be interspersed throughout the design pattern, depending on whether a bond pad via 344 is used to couple the bond pad 342 to a metal feature in the interconnect layer 326. In some embodiments, such as illustrated in FIG. 7b, some of the bond pads 342 between keep out zone 350 and the seal ring unit 336 may be active metal pads 342A and may be used for bonding to other devices, or for forming connectors thereon. In other embodiments not specifically illustrated, all bond pads 342 between the keep out zone 350 and seal ring unit 336 may be dummy metal pads 342B.

An area of the die 312 will interface with a keep out zone of another die which will be bonded to die 312. Removing bond pads 342 in this area which will bond with the other die's keep out zone produces keep out zone 350. Keep out zone 350 may include a portion of bond dielectric layer 340 in an inner part of die 312, such as areas over a portion of metal lines 327, vias 329, or optional metal pads 331 of interconnect structure 326. Keep out zone 350 may also include a portion of bond dielectric layer 340 over seal ring unit 336 (see, e.g., FIG. 7c). A pattern design for bond pads 342 may initially include bond pads in keep out zone 350. The pattern design may then be altered before manufacturing to remove bond pads 342 from the design where the keep out zone 350 is located on die 312. For example, as illustrated in FIG. 7b, keep out zone 350 corresponds in part to the location of where a keep out zone for another die will be bonded. The location of keep out zone 350 is thus based on where a second die will be bonded to die 312. When the second die has smaller footprint dimensions than die 312, the keep out zone 350 will be located at least in part at an inner portion of bond dielectric layer 340. In some embodiments, one or more edges of the two dies may be aligned so that part of the keep out zone 350 is over seal ring unit 336 and part of keep out zone 350 is over an interior part of die 312. In some embodiments, the bond pad vias 344 which correspond to the bond pads 342 which are removed, may also be removed from the design, while in other embodiments, some may remain in the design. Some embodiments may have a combination where some of the bond pad vias 344 remain and some are removed, such as illustrated in FIG. 7b.

Referring now to FIG. 7c, FIG. 7c illustrates a top view of a corner portion of die 312. Although seal ring unit 336 and crack stoppers 330 would not be visible in the top view, they have been illustrated for context and provided with dashed outside edges. A keep out zone 350 provides an area over die 312 which is free from bond pads 342. The keep out zone 350 may continue along an edge of die 312 over a portion of the seal ring unit 336, in some embodiments. In other embodiments, the keep out zone 350 may be completely within the seal ring unit 336 outline, such that the keep out zone 350 does not overlap any of the seal ring unit 336. The top surface of the seal ring unit 336 is below the surface of the bond dielectric layer 340. As such, the keep out zone 350 provides a dielectric bond area continuously extending from one edge of the keep out zone to the other edges of the keep out zone for fusion bonding to the keep out zone of another die while being unencumbered by any metal features. When the keep out zone 350 is aligned to a keep out zone on another die, and bonded thereto, the bond yield rate is improved. The keep out zone 350 provides a dielectric bond area for fusion bonding to another die, such as die 412 (discussed below with respect to FIGS. 10a through 10c).

Figure 8:
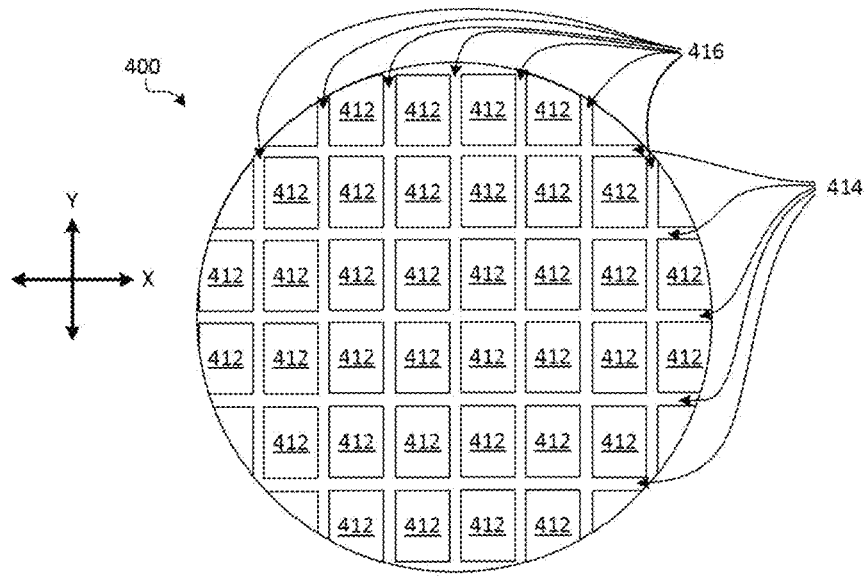
FIG. 8 illustrates a schematic top view of wafer, in accordance with some embodiments.

FIGS. 8 through 10c illustrate another die 412 in accordance with some embodiments. FIG. 8 illustrates a schematic top view of wafer 400 in accordance with some embodiments. Wafer 400 includes dies 412 and the adjoining scribe lines 414 and 416 similar to scribe lines 114 and 116 of FIG. 1. The foot print of die 412 may be designed to have a smaller area than the foot print of die 312. In some embodiments, die 412 may have a dimension in common with the foot print of die 312 (e.g., having the same width, but different lengths, or vice-versa), while in other embodiments, die 412 may have a smaller width and length than that of die 312.

Figure 9A:
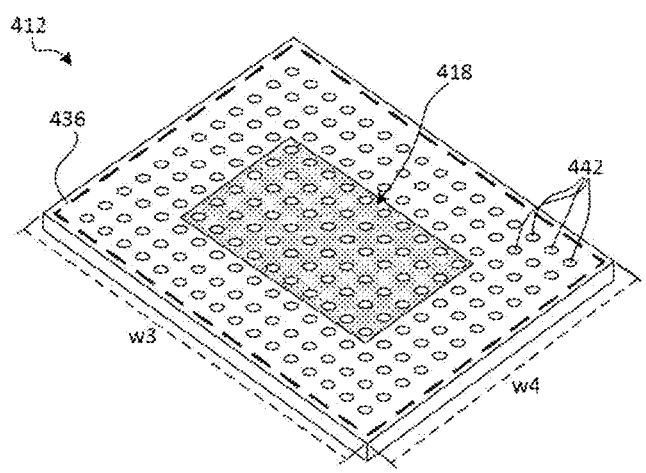
FIGS. 9a through 9c illustrate various views of a die, in accordance with some embodiments.

FIG. 9a illustrates a schematic perspective view of die 412. Die 412 in FIG. 9a may be singulated from wafer 400 or may still be intact with wafer 400. Seal ring unit 436 (shown in phantom) is disposed at a periphery of die 412 under the surface of die 412 and may include one or more distinct seal rings (described in greater detail below with respect to FIGS. 9b and 9c). In some embodiments, die 412 comprises an array of bond pads 442 set over and around a device area 418 of die 412. In some embodiments, the device area 418 may include the entire area of die 412 within seal ring unit 436. In other embodiments, the device area 418 may include a portion of the area of die 412 within seal ring unit 436, such as illustrated in FIG. 9a. In some embodiments, the device area 418 may include all the available bond pads 442 on the die or a subset of the available bond pads 442. Arrangements of bond pads 442 may be made in a pattern other than an array pattern. Bond pads 442 may be sized similarly or differently, depending on the design of the bond pads 442 on die 412.

Die 412 may be a similar device as die 112, in some embodiments, and may have similar dimensions thereto, including thicknesses of the layers and so forth. Die 412 has a smaller footprint than die 312 in at least one lateral dimension, such that, when bonded to die 312, die 312 overlaps die 412 by one or more edges. Die 412 may have first width, e.g., in the X direction of w3, which may be between about 2000 μm and about 26000 μm, such as about 10000 μm. Die 412 may have second width (or length), e.g., in the Y direction of w4, which may be between about 2000 μm and about 33000 μm, such as about 10000 μm. Other dimensions for die 412 may be used. In some embodiments, die 412 may include a logic device or memory device such as memory cells including, and not limited to, Static Random Access Memory (SRAM) cells, Dynamic Random Access Memory (DRAM) Cells, Magneto-Resistive Random Access Memory (MRAM) cells, or the like. Die 412 may include other types of devices.

Figure 9B:
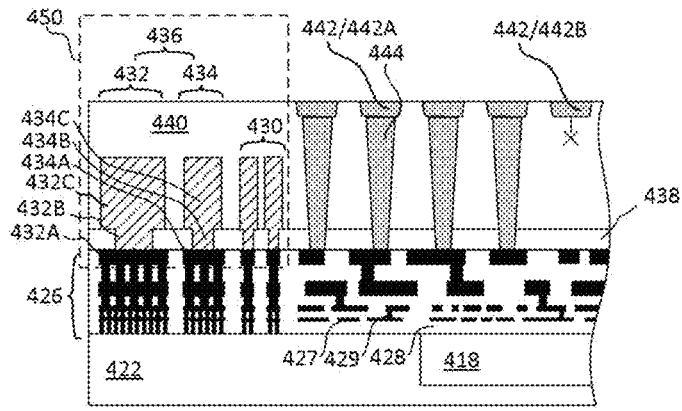

FIG. 9b illustrates a cross-sectional view of die 412. The cross-section of FIG. 9b is a portion of a cross-section taken along the line A-A of FIG. 9c, however the details may be varied from one view to another for the purposes of discussion. Die 412 includes a substrate 422, similar to substrate 122 and device area 418, similar to device area 118.

An interconnect structure 426 may be formed over substrate 422. Interconnect structure 426 may include insulating layers 428 and conductive features (e.g., metal lines 427, vias 429, and optional metal pads 431). Interconnect structure 426 may connect various active and/or passive devices in device area 418 of substrate 422 to form functional circuits. Interconnect structure 426 may be formed using materials and processes similar to those discussed above with respect to interconnect structure 126 of FIG. 2b, which are not repeated.

Interconnect structure 426 also includes a seal ring structure 432A, similar to seal ring structure 132A of FIG. 2b. Other seal ring structures, such as seal ring structure 434A may also be formed in interconnect structure 426. Seal ring structure 432A and seal ring structure 434A may be formed in a similar manner as the other layers of the interconnect structure 426.

A passivation layer 438 may be formed over the interconnect structure 426 and patterned to form openings therein, exposing a top metal layer of the interconnect structure 426 and exposing a top metal layer of the seal ring structure 432A and a top metal layer of the seal ring structure 434A. Passivation layer 438 may be formed using processes and materials such as those discussed above with respect to passivation layer 138, which are not repeated.

Seal ring structure 432A may be extended through and over the passivation layer 438. A via 432B may be formed in the passivation layer 438 and an overlying seal ring metal 432C may be formed over the passivation layer 438. The resulting seal ring 432 may therefore comprise seal ring structure 432A in interconnect structure 426, seal ring via 432B through passivation layer 438, and seal ring metal 432C. In some embodiments, additional seal rings may be included, such as seal ring 434, which has similar layers as seal ring 432. Seal ring unit 436 may comprise all of the seal rings surrounding the periphery of the die (e.g., seal ring 432, seal ring 434, and so forth). Seal ring metal 432C and seal ring metal 434C may form a continuous loop around the periphery of the die in a top down view.

Seal ring via 432B and seal ring via 434B may be formed using processes and materials such as those discussed above with respect to seal ring via 132B and seal ring via 134B, which are not repeated. Similarly, seal ring metal 432C and seal ring metal 434C may be formed using processes and materials such as those discussed above with respect to seal ring metal 132C and seal ring metal 134C, which are not repeated.

Crack stoppers 430 may be formed around the die. Crack stoppers 430 may be formed using processes and materials such as described above with respect to crack stoppers 130 which are not repeated.

A bond dielectric layer 440 may be formed over the passivation layer 438 and seal ring unit 436. Bond dielectric layer 440 may be formed using processes and materials similar to those discussed above with respect to bond dielectric layer 140, which are not repeated.

Bond pads 442 are formed in bond dielectric layer 440, and may be electrically coupled to device area 418 through metal lines and vias, including bond pad vias 444. Bond pads 442 and bond pad vias 444 may be formed using processes and materials such as those discussed above with respect to bond pads 142 and bond pad vias 144, which are not repeated. Bond pads 442 may include a plurality of active metal pads 442A and a plurality of dummy metal pads 442B, similar to the active metal pads 142A and dummy metal pads 142B of FIG. 2b.

Still referring to FIG. 9b, the dummy metal pads 442B can be removed from the design pattern in bond dielectric layer 440 where the seal ring unit 436 of die 412 is located. Bond dielectric layer 440 will fusion bond with bond dielectric layer 340 of die 312 in this area. Keep out zone 450 illustrates the area of the bond dielectric layer 440 which is free from bond pads 442. Providing a design of a die, such as die 412 to include keep out zone 450 may be done in a manner similar to that described above with respect to FIG. 2b, which is not repeated. Other dummy metal pads 442B may be interspersed throughout the design pattern, depending on whether a bond pad via 444 is used to couple the bond pad 442 to a metal feature in interconnect structure 426.

Figure 9C:
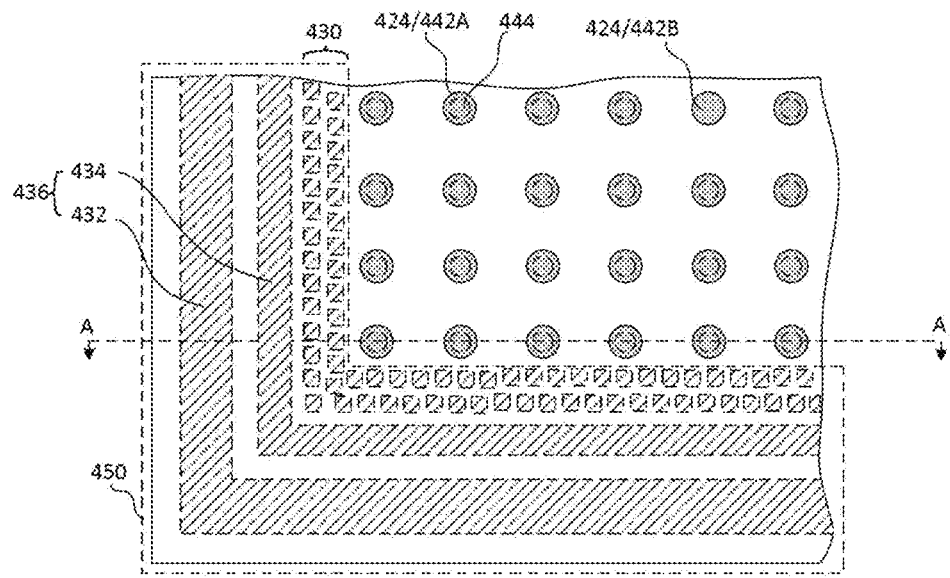

Referring now to FIG. 9c, FIG. 9c illustrates a top view of a corner portion of die 412. Although the seal ring unit 436 and crack stoppers 430 would not be visible in the top view, they have been illustrated for context and provided with dashed outside edges. The seal ring unit 436 comprising seal ring 432 and seal ring 434 is illustrated to continue around the periphery of die 412. All the bond pads 442 are contained within the seal ring unit 436. Keep out zone 450 for the seal ring unit 436 provides an area over the seal ring unit 436 which is free from bond pads 442. Keep out zone 450 is similar to keep out zone 150 of FIG. 2c, and includes a continuous dielectric surface layer from one edge of keep out zone 450 to the other edges of keep out zone 450, which is free from bond pads 442. The top surface of the seal ring unit 436 is below the surface of the bond dielectric layer 440. As such, the keep out zone 450 provides a dielectric bond area for fusion bonding to another die, such as die 312.

Figure 10A:
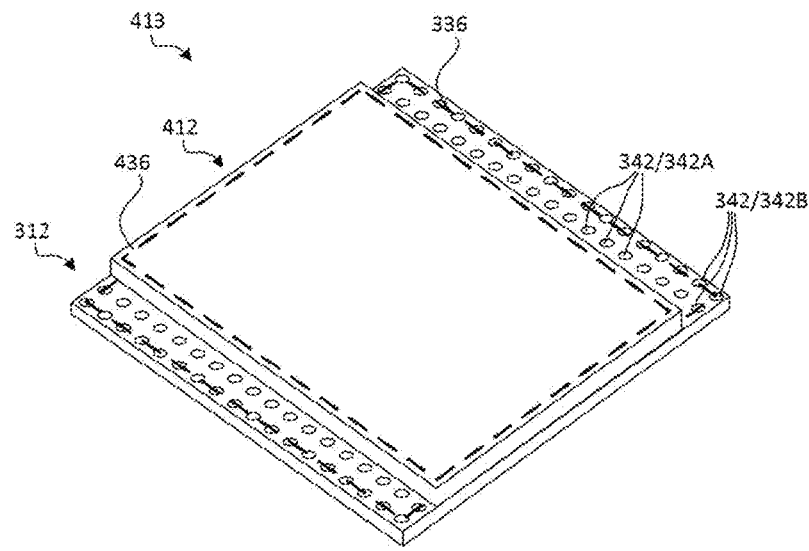
FIGS. 10a through 10c and FIG. 11 illustrates various views of two bonded dies, in accordance with some embodiments.

Referring to FIG. 10a, a schematic perspective view of die 312 bonded to die 412 is shown. Die 412 has been flipped over and bonded face-to-face with die 312. Seal ring unit 436 of die 412 is shown in phantom and would not be visible. As seen in FIG. 10a, die 412 has the same length as die 312, but is narrower than die 312. Die 412 has been positioned on die 312 so that two of the edges of each die are aligned with a corresponding edge of the opposite die. In other examples, die 412 may be positioned on die 312 so that a third edge of each die is aligned with a corresponding edge of the opposite die. In other examples, die 412 may be smaller in both length and width than die 312 and may be positioned on die 312 such that zero or one edge of each die is aligned with a corresponding edge of the opposite die.

Figure 10B:
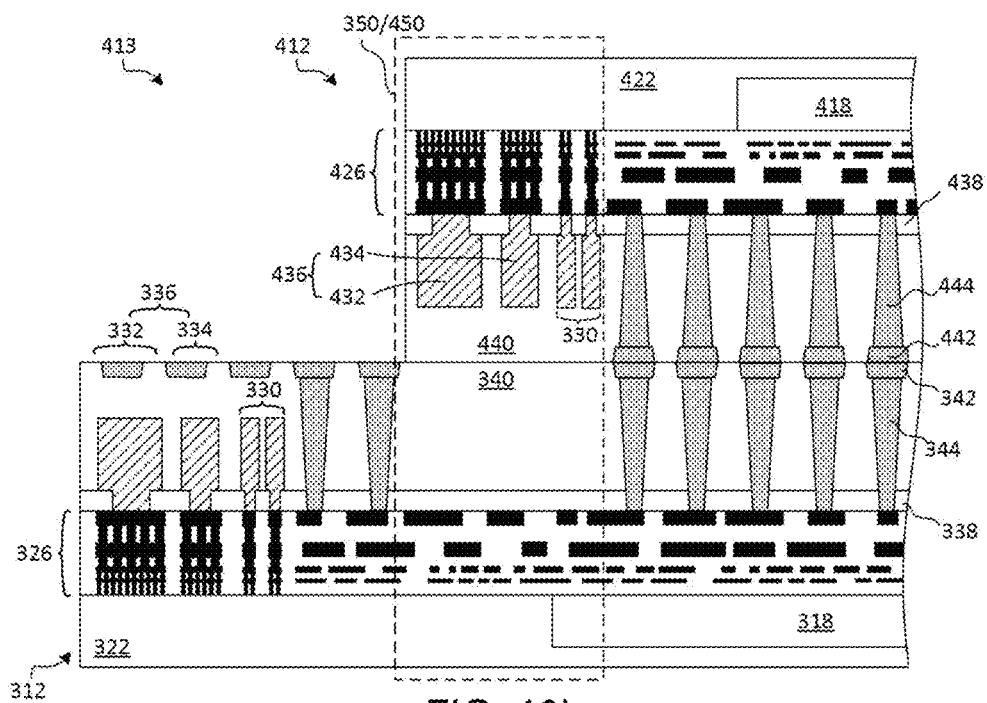

Referring now to FIG. 10b, FIG. 10b illustrates a cross-section that includes die 312 bonded to die 412 to form die package 413. Bonding can be chip-to-chip where two singulated chips (or dies) are directly bonded together or chip-to-wafer where one or more chips (or dies) are directly bonded together to a wafer (e.g., wafer 300). The direct bonding may be accomplished by hybrid bonding, which an example process is described above with respect to FIG. 5.

As shown in FIG. 10b, bond pads 342 and bond pads 442 are bonded to each other with a one-to-one correspondence. In some embodiments, each of bond pads 342 has a corresponding bond pad 442 to bond to, and each of bond pads 442 has a corresponding metal pad 342 to bond to. In some embodiments, bond pads 342 which are outside the footprint of die 412 (exposed from die 412) may remain unbonded. In some embodiments, bond pads 342 outside the footprint of die 412 may be bonded to another die (not shown) using similar processes and materials as the bonding to die 412. Active metal pads 342A are bonded to active metal pads 442A, and dummy metal pads 342B are bonded to dummy metal pads 442B. In some embodiments, dummy metal pads of one die or the other may be bonded to active metal pads of the opposite die. For example, dummy metal pad 342B may be bonded to active metal pad 442A. In some embodiments, a slight misalignment might occur in the pattern or in the alignment of one wafer to the other and a portion of one or more of bond pads 342 may slightly overhang or underhang a corresponding one of bond pads 442.

Figure 10C:
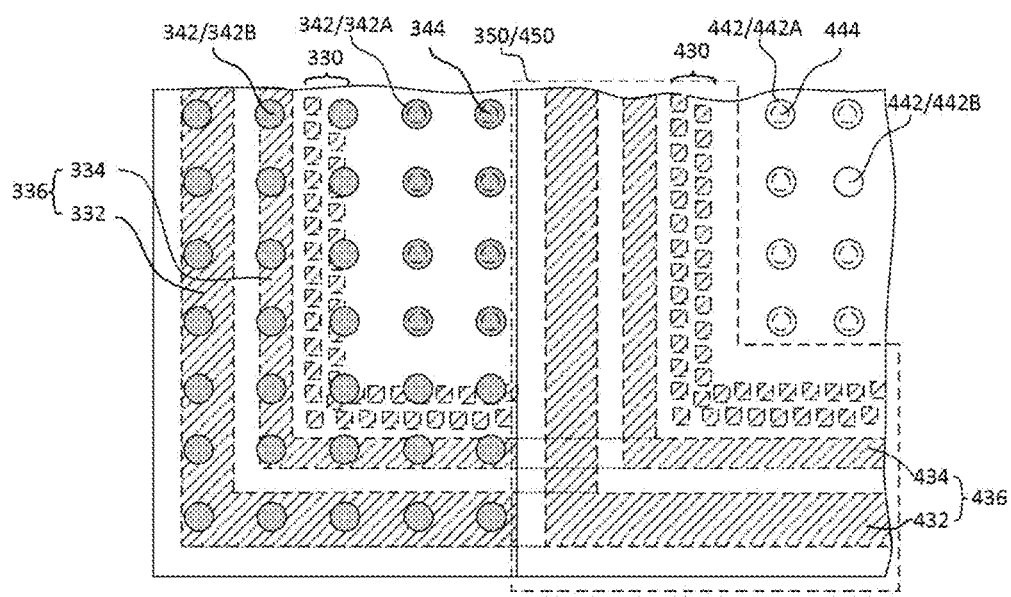

FIG. 10c illustrates a top view of a corner portion of die 312 bonded to die 412. As shown in FIG. 10c, the keep out zones 350 and 450 are aligned to provide a direct fusion bonding of the bond dielectric layer 340 to the bond dielectric layer 440 in that area. As shown in FIG. 10c, in some embodiments, an edge of die 312 may be aligned to an edge of die 412. Die 412 is flipped over and bonded to die 312. The seal ring unit 436, crack stoppers 430 and bond pads 442 would not be visible, but have been illustrated for context.

Figure 11:
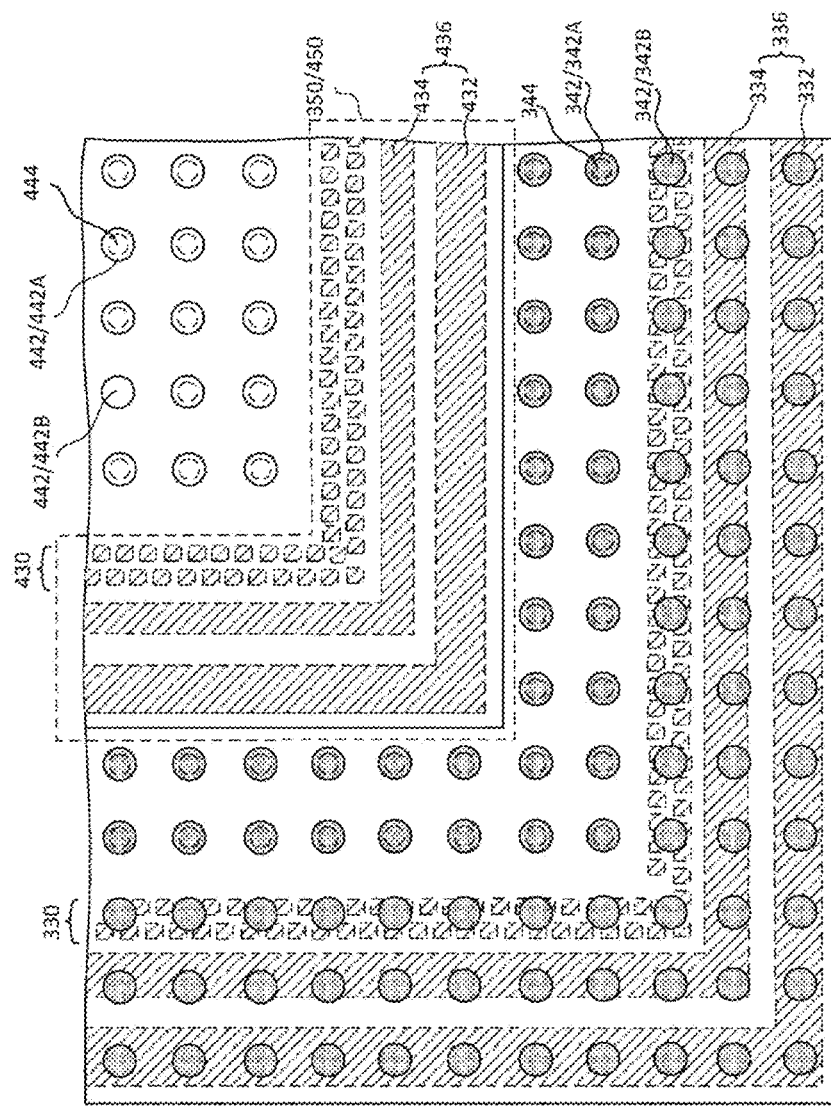

Referring to FIG. 11, FIG. 11 illustrates another embodiment where a die 312 is bonded to die 412 having a smaller footprint (see FIG. 9a and its accompanying description), similar to the view of FIG. 10c. As shown in FIG. 11, two or more adjacent edges of die 412 are not aligned to corresponding adjacent edges of die 312. In some embodiments, some edges may be aligned while in other embodiments, none of the edges are aligned.

Figure 12:
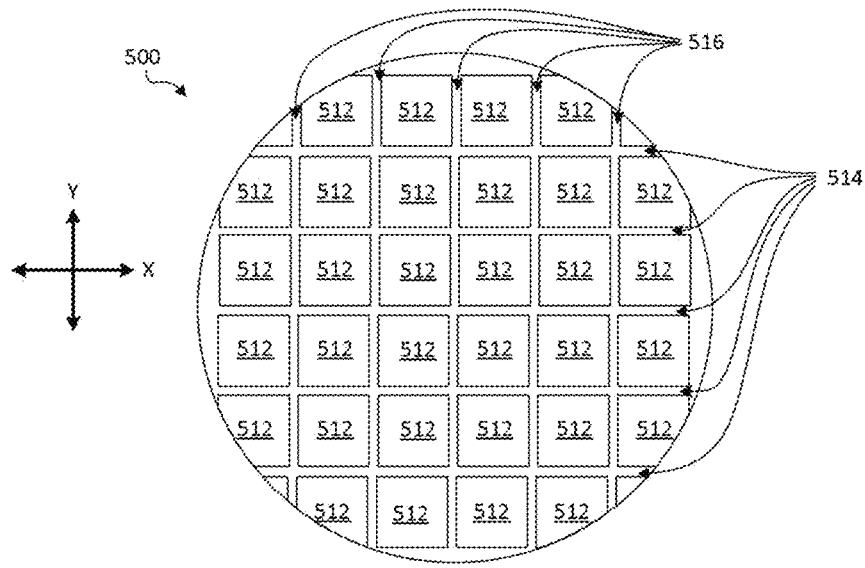
FIG. 12 illustrates a schematic top view of wafer, in accordance with some embodiments.
Figure 13A:
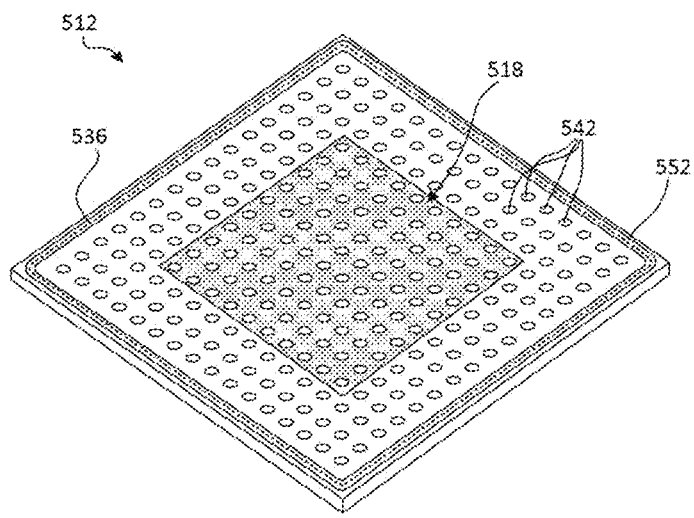
FIGS. 13a through 13c illustrate various views of a die, in accordance with some embodiments.
Figure 13B:
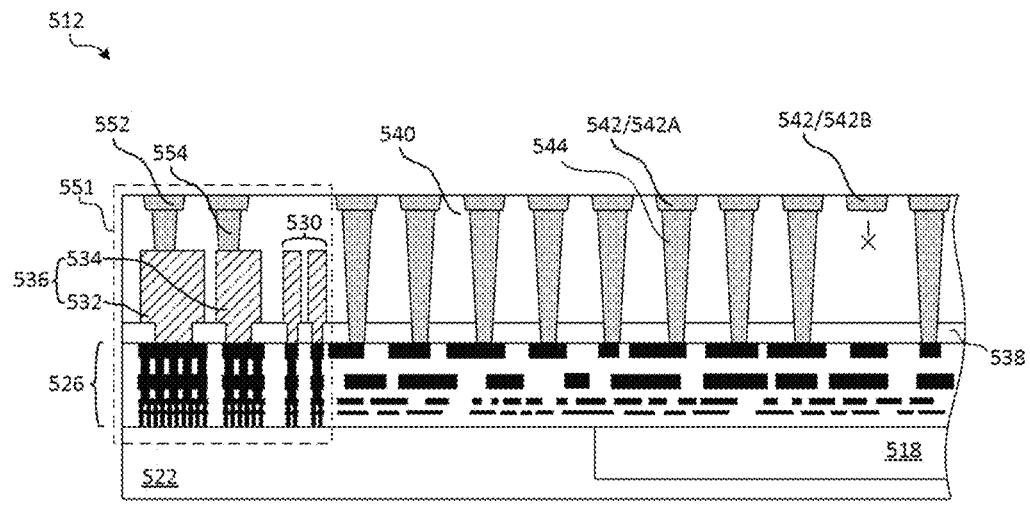
Figure 13C:
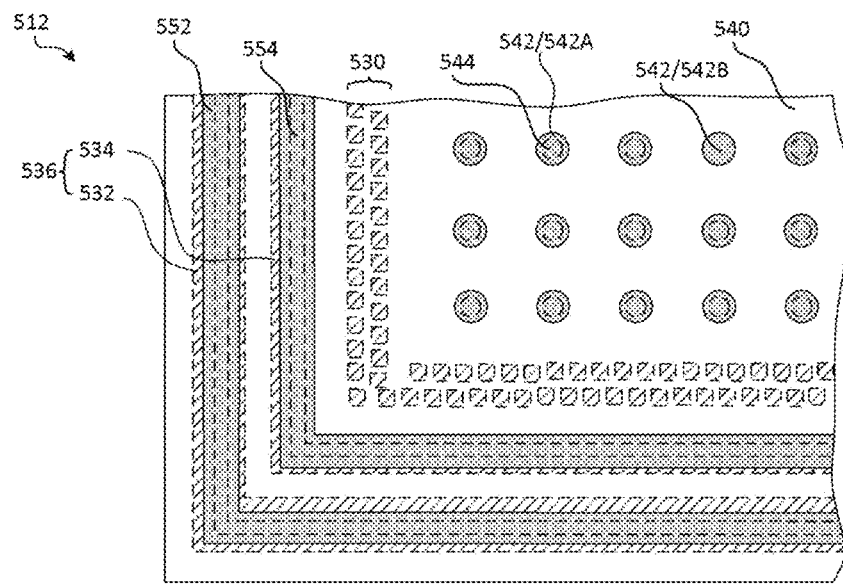

FIGS. 12 through 13c illustrate another embodiment for a seal ring design which includes bond pads over the seal ring unit, but couples the bond pads over the seal ring unit to the seal ring. Referring to FIG. 12, FIG. 12 illustrates a wafer 500 having dies 512 disposed thereon. Wafer 500 and dies 512 are substantially similar to the wafer 100 and dies 112, except as described below. Accordingly, the details for dies 512 are omitted for the sake of brevity. Referring to FIG. 13a, die 512 contains similar features and structures as dies 112 including a seal ring unit 536, device area 518, and bond pads 542. In addition, die 512 includes additional ring-like bond pads 552. Ring-like bond pads 552 include a ring-like structure disposed over and coupled to each of the seal ring unit 536.

Referring to FIG. 13b, a cross-section of die 512 is illustrated in accordance with some embodiments. Die 512 contains similar features and structures as die 112, including substrate 522, interconnect structure 526, passivation layer 538, bond dielectric layer 540, and a seal ring unit 536 which may include one or more seal rings 532 and 534, each including a seal ring structure 532A (and 534A) in the interconnect structure 526, a seal ring via 532B (and 534B), and seal ring metal 532C (and 534C). Die 512 may also include crack stoppers 530. Die 512 also includes bond pad 542, including active metal pads 542A coupled to a metal feature in the interconnect structure 526 by bond pad vias 544 and dummy metal pads 542B which are not coupled to the interconnect structure 526. In addition to these common features, as noted above, die 512 includes one or more ring-like bond pads 552 coupled to each of the seal ring structures in seal ring unit 536. The ring-like bond pads 552 may be formed in a continuous ring around the periphery of die 512 disposed over the seal ring structures. The ring-like bond pads 552 are coupled to the seal ring by one or more bond pad vias 554. In some embodiments, bond pad vias 554 may be disposed at regular intervals around the ring-like bond pads 552. In other embodiments, the one or more bond pad vias 554 may also be ring-like, and are formed in a trench all around the periphery of die 512. An inactive zone 551 is located at the periphery of die 512. Inactive zone 551 is similar to keep out zone 150 of FIG. 2b, except that ring-like bond pads 552, bond pad vias 554, and optional dummy metal pads 542/542B may be included. Although ring-like bond pads 552 are inactive, they are coupled to the underlying seal ring unit 536. In some embodiments, other dummy metal pads 542/542B which are not coupled to any underlying features may also be included in inactive zone 551.

In some embodiments, bond pad vias 554 may be formed in a manner similar to the bond pad vias 544, which is not repeated. In other embodiments, bond pad vias 554 may be formed in a separate processing step than the forming of the bond pad vias 544. For example, a first resist layer can be patterned to expose portions of dielectric bond layer 540 corresponding to bond pad vias 554. Openings in dielectric bond layer 540 may then be formed to expose seal ring unit 536. A conductive material may then be deposited in the openings to form bond pad vias 554. The process can be repeated using a second resist layer to form bond pad vias 544. The order for forming bond pad vias 544 and bond pad vias 554 can be reversed. In some embodiments, the openings for each of bond pad vias 544 and bond pad vias 554 can be separately formed, as described above, and then the conductive material deposited simultaneously.

Ring-like bond pad 552 may be formed in a manner similar to the bond pads 542, which is not repeated. By forming a bond pads over the seal ring, which are attached to the seal ring, the bonding of die 512 to another die is improved over having dummy bond pads alone.

Inactive zone 551 may be created in a manner similar to that of keep out zone 150 of FIG. 2b. A pattern design for bond pads 542 may initially include bond pads in inactive zone 551. The pattern design may then be altered to remove bond pads 542 from the design where inactive zone 551 is located on die 512. For example, as illustrated in FIG. 13b, inactive zone 551 corresponds to the location of the seal ring unit 536 and extends into the inner part of die 512 over the crack stoppers 530 and over a portion of a metal line of interconnect structure 526. In other embodiments, the inactive zone may be located in other areas of the die (see, e.g., FIG. 7b). The location of inactive zone 551 is based on where a second die will be bonded to die 512. When the second die has the same footprint dimensions, inactive zone 551 will be located at the periphery of the die, corresponding to the area of seal ring unit 536. When the second die has a smaller footprint, inactive zone 551 will be located at least in part in an interior part of the die 512. Examples of such embodiments are described in greater detail below with respect to FIGS. 15 and 16.

Figure 14:
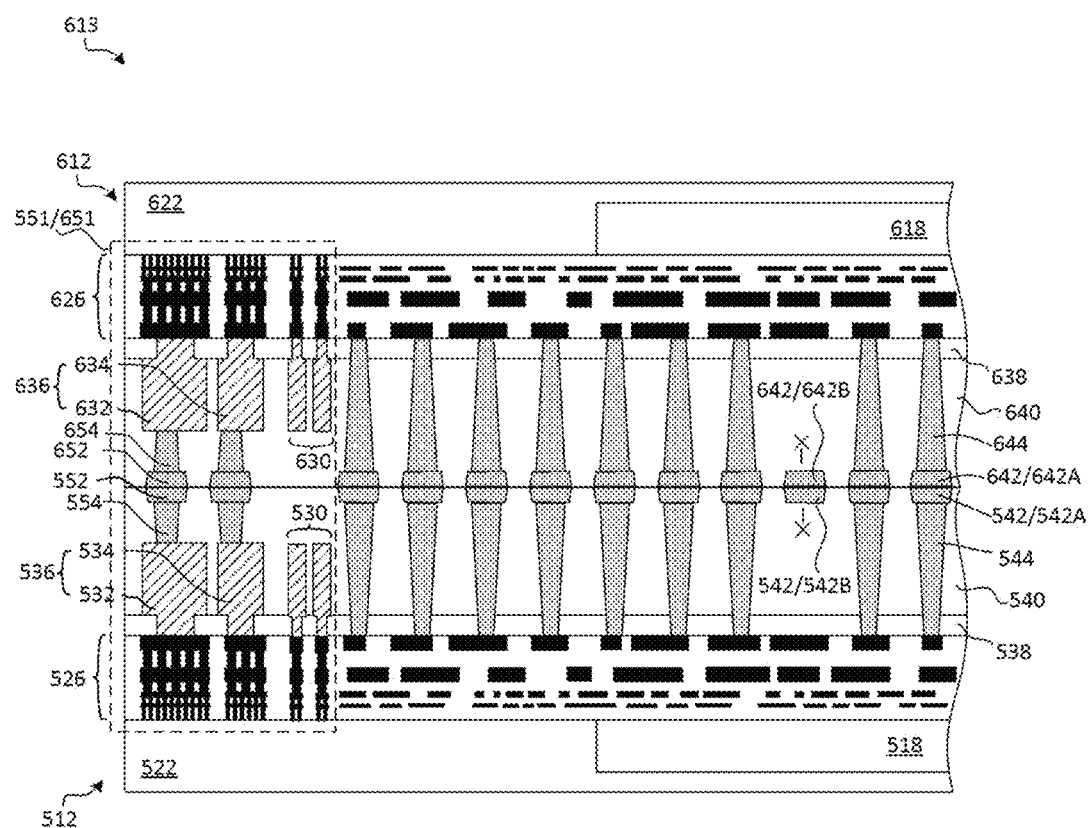
FIG. 14 illustrates a cross-sectional view of two bonded dies, in accordance with some embodiments.

Referring now to FIG. 14, die 512 is bonded to a similarly formed die 612, in accordance with some embodiments. Die 612 has similar features as die 512 with corresponding elements labelled similarly, except that the elements begin with a "6" instead of a "5." Die 512 and die 612 may be bonded as a wafer-to-wafer, chip-to-chip, or chip-to-wafer process. Die 512 and die 612 may be hybrid bonded to each other, for example, using a hybrid bonding process such as described above with respect to FIG. 5.

Figure 15:
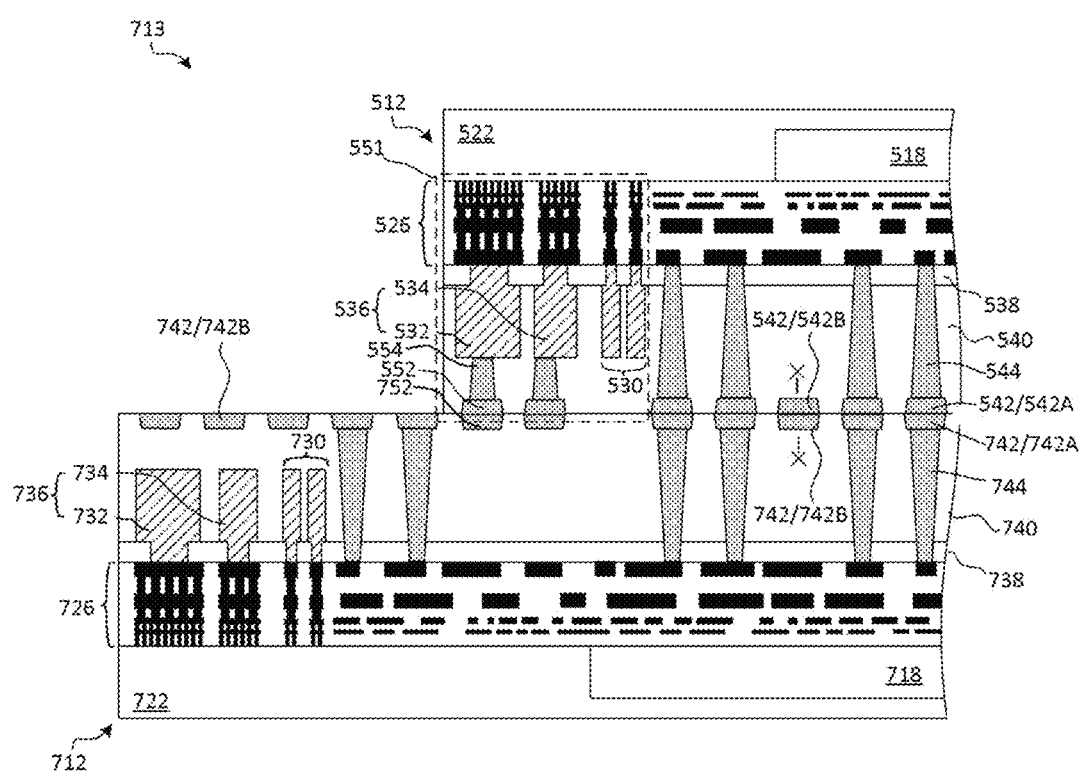
FIG. 15 illustrates a cross-sectional view of two bonded dies, in accordance with some embodiments.

Referring now to FIG. 15, die 512 is bonded to another die 712, in accordance with some embodiments. Die 712 has similar features as die 512 with corresponding elements labelled similarly, except that the elements begin with a "7" instead of a "5." In some embodiments, die 712 may be formed using processes consistent with those discussed above with respect to die 312, except for the inclusion of a keep out zone. Similar to that described above with respect to FIG. 10b, however, die 512 is smaller than die 712 and at least one of the edges of the dies 712 and 512 are not aligned in top view (see, e.g., FIGS. 10c and 11). Similar to die 312 discussed above, the dummy metal pads 742B disposed over the seal ring unit 736 may be omitted in some embodiments. Die 712 may also include ring-like bond pads 752, similar to ring-like bond pads 552, as discussed above. Die 512 and die 712 may be hybrid bonded to each other, for example, using a hybrid bonding process such as described above with respect to FIG. 5. Ring-like bond pads 752 in die 712 interfacing with inactive zone 551 of die 512 may be bonded to the ring-like bond pads 552 of die 512.

Figure 16:
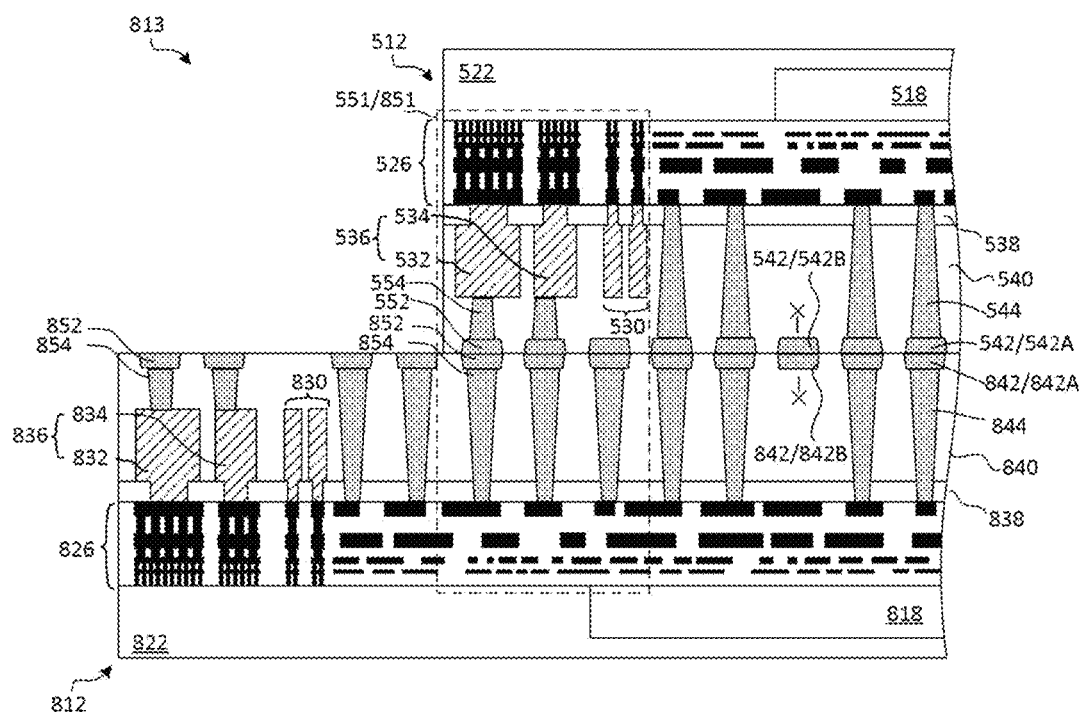
FIG. 16 illustrates a cross-sectional view of two bonded dies, in accordance with some embodiments.

Referring now to FIG. 16, die 512 is bonded to another die 812, in accordance with some embodiments. Die 812 has similar features as die 512 with corresponding elements labelled similarly, except that the elements begin with an "8" instead of a "5." Die 812 may be formed to be substantially similar to die 712, except that instead of a keep out zone, die 812 includes inactive zone 851 including ring-like bond pads 852 (and bond pad vias 854) aligned with the ring-like bond pads 552 as well as ring-like bond pads 852 (and bond pad vias 854) aligned with and coupled to the seal ring 832 and seal ring 834 of seal ring unit 836. Ring-like bond pads 852 (and bond pad vias 854) may be formed using processes and materials similar to those discussed above with respect to ring-like bond pads 552 (and bond pad vias 554). Die 512 and die 812 may be hybrid bonded to each other, for example, using a hybrid bonding process such as described above with respect to FIG. 5. One of skill will understand that the different features of FIGS. 15 and 16 may be combined in another embodiment.

Figure 17:
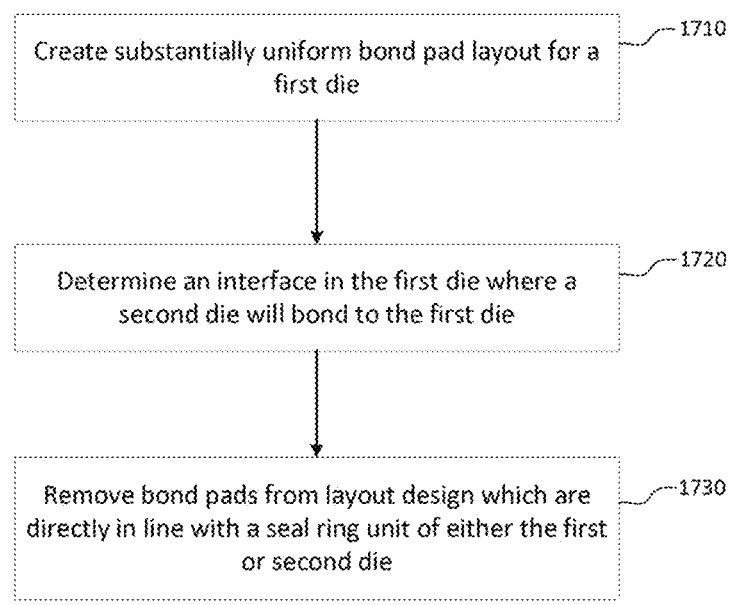
FIG. 17 is a flow diagram for altering the design layout of bond pads on a die, in accordance with some embodiments.

FIG. 17 illustrates a flow diagram for altering a bond pad design to accommodate a keep out area, in accordance with some embodiments. In step 1710, a substantially uniform bond pad layout for a first die is created. A substantially uniform bond pad layout can include a layout of bond pads with no more than about 10% variation in pattern and/or bond pad sizes. At step 1720, an interface in the first die is determined where a second die will bond to the first die. The second die and first die will mate according to how the bond pads in each respective die are configured to be coupled together. Once the interface is determined, the dummy metal bond pads around the periphery of the first or second die can be removed from the design. In some embodiments, where the first and second die have the same sizes, the first die will interface with the second die across its entire surface. In some embodiments where the first or second die is smaller than the other, the interface between the two dies will be smaller than the entire surface area for one of the dies.

At step 1730, the dummy metal bond pads are removed from the layout design in the first and second dies which are directly in line with a seal ring unit of either the first die or the second die. In other words, the dummy metal bond pads are removed from the layout design in the first die where the second die's seal ring would be directly in line. Likewise, the dummy metal bond pads are removed from the layout design in the second die which are directly in line with the second die's seal ring. This provides that the corresponding dummy metal bond pads in the each die are removed from the design.

Figure 18:
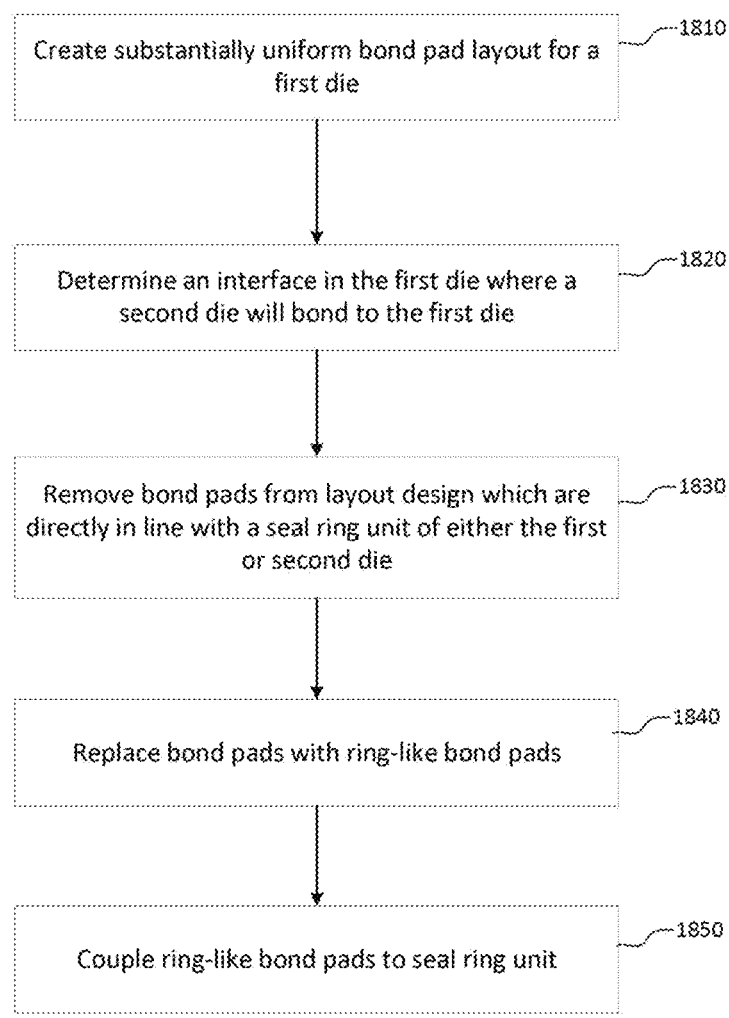
FIG. 18 is a flow diagram for altering the design layout of bond pads on a die, in accordance with some embodiments.

FIG. 18 illustrates a flow diagram for altering a bond pad design to provide a ring-like dummy bond pad which is coupled to a seal ring, in accordance with some embodiments. In step 1810, a substantially uniform bond pad layout for a first die is created. A substantially uniform bond pad layout can include a layout of bond pads with no more than about 10% variation in pattern and/or bond pad sizes. At step 1820, an interface in the first die is determined where a second die will bond to the first die. The second die and first die will mate according to how the bond pads in each respective die are configured to be coupled together. In some embodiments, where the first and second dies have the same size, the first die will interface with the second die across its entire surface. In some embodiments where the first or second die is smaller than the other, the interface between the two dies will be smaller than the entire surface area for one of the dies.

At step 1830, after the interface is determined, the dummy metal bond pads are removed from the layout design in the first and second dies which are directly in line with a seal ring unit of either the first die or the second die. In other words, the dummy metal bond pads are removed from the layout design in the first die where the second die's seal ring would be directly in line. Likewise, the dummy metal bond pads are removed from the layout design in the second die which are directly in line with the second die's seal ring. This provides that the corresponding dummy metal bond pads in the each die are removed from the design.

At step 1840, the removed bond pads are replaced with a ring-like bond pads which are coupled to the underlying seal ring unit in step 1850. The coupling can be done by individual bond pad vias disposed along the ring-like bond pads in some embodiments. In other embodiments, the coupling can be done by a ring-like bond pad via disposed under the ring-like bond pads which is physically and electrically coupled to both the ring-like bond pads and the seal ring unit at the periphery of the die. In some embodiments, the bond pad vias can be coupled to an interconnect layer of the die.

Embodiments provide a way to increase bond yield by providing a better hybrid bonding interface to provide fusion bonding of oxide materials in two dies and direct metal-to-metal bonding of metal materials in the two dies. Removing dummy bond pads over the seal rings provides a better bonding interface for fusion bonding oxide bonding layers. In some embodiments, after removing the dummy bond pads from the design, a ring-like bond pad can be used which is coupled to the seal ring or an interconnect of the die. Embodiments include wafer-on-wafer, chip-on-chip, and chip-on-wafer bonding where the die sizes may match or may be different.

One embodiment is a structure including a first die. The first die includes a first oxide bonding layer having a first plurality of bond pads disposed therein and a first seal ring disposed in the first oxide bonding layer, where the first oxide bonding layer extends over the first seal ring. The structure further includes a second die. The second die includes a second oxide bonding layer having a second plurality of bond pads disposed therein, where the first plurality of bond pads is bonded to the second plurality of bond pads, where the first oxide bonding layer is bonded to the second oxide bonding layer, and where an area interposed between the first seal ring and the second oxide bonding layer is free of bond pads.

Another embodiment is a method including determining an alignment of a first die to a second die by aligning active bond pads of the first die to corresponding active bond pads of the second die, where a first area of the first die and a second area of the second die are aligned with a seal ring of the second die. All bond pads are removed in the first area of the first die and in the second area of the second die. The first die is bonded to the second die according to the alignment.

Another embodiment is a method including determining a first device layout of bond pads disposed at a surface of a first device. A second device layout of bond pads disposed at a surface of a second device is determined, the second device having a seal ring. An alignment which aligns a first active bond pad of the first device to a second active bond pad of the second device is determined, where the alignment causes the seal ring to align with a first region of the first die. First bond pads in the first region are removed from the first device layout of bond pads. Second bond pads are removed from a second region of the second device which align with the first bond pads according to the alignment. The first active bond pad is bonded to the second active bond pad. The first region is bonded to the second region.

One embodiment is a structure including a first die and a second die bonded to the first die. The first die includes a first bonding layer, a first plurality of bond pads disposed in the first bonding layer, and a first seal ring disposed at a periphery of the first die. The second die includes a second die bonded to the first die, the second die includes a second bonding layer, a second plurality of bond pads disposed in the second bonding layer, a third plurality of bond pads comprising a subset of the second plurality of bond pads, wherein the first plurality of bond pads is respectively bonded to the third plurality of bond pads, and wherein an area interposed between the first seal ring and the second bonding layer is free of active bond pads.

Another embodiment is a method including aligning a first die to a second die by aligning first bond pads of the first die to corresponding second bond pads of the second die, where a first area of the first die is aligned with a second area of the second die. The second area of the second die corresponds to a location of a seal ring of the second die. The first area is free of active bond pads. The first die is bonded to the second die, where a first edge of the first die is not aligned with a second edge of the second die.

Another embodiment is a device including a first device area and a first interconnect structure disposed over the first device area. The first interconnect structure is electrically coupled to the first device area. The first interconnect structure includes one or more insulating layers, one or more metallization layers disposed within the one or more insulating layers, and a seal ring structure embedded in the one or more insulating layers and disposed at a periphery of the first interconnect structure. The device also includes a bond dielectric layer disposed over the first interconnect structure. The device further includes a seal ring metal embedded within the bond dielectric layer and physically coupled to the seal ring structure. The device also includes a first set of active bond pads disposed at a first surface of the bond dielectric layer, each of the bond pads of the active bond pads electrically coupled to the first interconnect structure by a corresponding metal via. The device includes a first set of dummy bond pads disposed at the first surface of the bond dielectric layer. A keep out zone is in the bond dielectric layer, the keep out zone being free of any active bond pads, the keep out zone including a metal element.

Another embodiment is a structure including: a base die including a first plurality of bond pads disposed at an upper surface of the base die at a die attach area, a second plurality of bond pads disposed at the upper surface of the base die outside the die attach area, and a keep out area interposed between the first plurality of bond pads and the second plurality of bond pads, the keep out area free of bond pads.

Another embodiment is a method including aligning first bond pads of a first die to second bond pads of a second die and aligning a first bond pad free region of the first die with a second bond pad free region of the second die. The method also includes and fusing a dielectric material in the first bond pad free region with a dielectric material in the second bond pad free region.

Another embodiment is a device including a first device area. The device also includes a first interconnect structure disposed over the first device area. The device also includes a first dielectric layer disposed over the first interconnect structure. The device also includes a seal ring structure embedded in the first dielectric layer, the seal ring structure disposed at a periphery of the first dielectric layer. The device also includes bond pads disposed at an upper surface of the first dielectric layer, the bond pads distributed across the upper surface of the first dielectric layer in a regular pattern except in a keep out zone of the first dielectric layer, the bond pads including a set of active bond pads and a set of dummy bond pads, each of the bond pads of the set of active bond pads electrically coupled to the first interconnect structure by a corresponding metal via, the keep out zone free of the bond pads.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
   a base die, the base die comprising:
   a first plurality of bond pads disposed at an upper surface of the base die at a die attach area, the first plurality of bond pads arranged on the upper surface at a pitch p1 separating them from each other,
   a second plurality of bond pads disposed at the upper surface of the base die outside the die attach area, the second plurality of bond pads arranged on the upper surface at the pitch p1 separating them from each other, wherein a pitch p2 between a first bond pad of the first plurality of bond pads and a second bond pad of the second plurality of bond pads is a multiple of the pitch p1, wherein p2 is greater than p1, and a keep out area interposed between the first plurality of bond pads and the second plurality of bond pads, the keep out area free of bond pads; and a second die bonded to the base die, the second die comprising:
a third plurality of bond pads disposed at a lower surface of the second die, the third plurality of bond pads bonded to the first plurality of bond pads, and
a second seal ring embedded in the second die, the second seal ring aligned to the keep out area of the base die.

2. The structure of claim 1, wherein the base die further comprises a first bonding layer laterally surrounding the first plurality of bond pads and the second plurality of bond pads, wherein the first bonding layer is fused to a second bonding layer of the second die.

3. The structure of claim 1, further comprising a ring-like bonding layer disposed at an upper surface of the base die in the keep out area.

4. The structure of claim 1, wherein the first plurality of bond pads is directly bonded to the third plurality of bond pads in a metal-to-metal bond which is free of a eutectic material.

5. The structure of claim 1, wherein the base die further comprises a first seal ring, wherein the first seal ring and the second seal ring are aligned on a first edge of the second die.

6. The structure of claim 5, wherein the second seal ring is laterally separated from the first seal ring along a second edge of the second die and corresponding second edge of the base die.

7. A method, comprising:
aligning first bond pads of a first die to second bond pads of a second die and aligning a first bond pad free region of the first die with a second bond pad free region of the second die; and
fusing a dielectric material in the first bond pad free region with a dielectric material in the second bond pad free region, wherein the second bond pad free region corresponds to a location of a seal ring of the second die.

8. The method of claim 7, wherein the first bond pads are distributed across a face of the first die in a regular pattern except in the first bond pad free region, wherein the second bond pads are distributed across a face of the second die in a regular pattern except in the second bond pad free region.

9. The method of claim 7, wherein the first bond pad free region corresponds to an interior region of the first die.

10. The method of claim 7, further comprising:
directly bonding a metal of the first bond pads to a metal of the second bond pads without using a solder material.

11. The method of claim 7, further comprising:
bonding a first surface bonding ring of the first die to a second surface bonding ring of the second die to electrically couple a seal ring structure of the second die to a metal feature of the first die.

12. The method of claim 11, wherein the metal feature of the first die is a seal ring structure of the first die.

13. The method of claim 7, wherein an edge of the second die after the fusing is aligned to an interior portion of the first die.

14. A device comprising:
a first device area;
a first interconnect structure disposed over the first device area;
a first dielectric layer disposed over the first interconnect structure;
a seal ring structure embedded in the first dielectric layer, the seal ring structure disposed at a periphery of the first dielectric layer; and
bond pads disposed at an upper surface of the first dielectric layer, the bond pads distributed across the upper surface of the first dielectric layer in a regular pattern except in a keep out zone of the first dielectric layer, the bond pads including a set of active bond pads and a set of dummy bond pads, each of the bond pads of the set of active bond pads electrically coupled to the first interconnect structure by a corresponding metal via, the keep out zone free of the bond pads.

15. The device of claim 14, further comprising a ring-like metal bonding structure disposed at a surface of the keep out zone.

16. The device of claim 15, wherein the ring-like metal bonding structure is electrically coupled to the seal ring structure.

17. The device of claim 15, wherein the ring-like metal bonding structure is electrically coupled to a seal ring structure of a second device.

18. The device of claim 14, wherein the keep out zone is interposed between a first active bond pad of the set of active bond pads and a second dummy bond pad of the set of dummy bond pads, the second dummy bond pad being disposed over the seal ring structure.

19. The device of claim 14, wherein the keep out zone has a first portion running parallel to a first edge of the first device area and a second portion running parallel to a second edge of the first device area, the first portion perpendicular to the second portion.

20. The device of claim 14, further comprising a first bonding layer laterally surrounding the bond pads, wherein the first bonding layer is fused to a second bonding layer of an upper die.

* * * * *